(12) United States Patent
Marumoto et al.

(10) Patent No.: US 8,767,497 B2
(45) Date of Patent: Jul. 1, 2014

(54) SEMICONDUCTOR DEVICE PERFORMING SELF REFRESH OPERATION

(76) Inventors: Mio Marumoto, Tokyo (JP); Sachiko Edo, Tokyo (JP)

( * ) Notice: Subject to any disclaimer, the term of this patent is extended or adjusted under 35 U.S.C. 154(b) by 35 days.

(21) Appl. No.: 13/486,706

(22) Filed: Jun. 1, 2012

(65) Prior Publication Data

US 2012/0307582 A1  Dec. 6, 2012

(30) Foreign Application Priority Data

Jun. 2, 2011  (JP) ................................. 2011-124269

(51) Int. Cl.
*G11C 7/00*  (2006.01)
(52) U.S. Cl.
USPC ..................................... 365/222; 365/230.03
(58) Field of Classification Search
CPC ........... G11C 11/406; G11C 11/40615; G11C 2211/4061

USPC ..................................... 365/222, 230.03, 149
See application file for complete search history.

(56) References Cited

U.S. PATENT DOCUMENTS 5,463,590 A  10/1995  Watanabe
2003/0128614 A1*  7/2003  Hidaka .......................... 365/222

FOREIGN PATENT DOCUMENTS

JP  05-002872  1/1993
JP  06-275071  9/1994

* cited by examiner

*Primary Examiner* — Huan Hoang
(74) *Attorney, Agent, or Firm* — Foley & Lardner LLP

(57) ABSTRACT

When refresh activation signals (REFACT0 to REFACT3) are supplied, the internal memory cells in two or more memory banks (0 to 3) are refreshed. A refresh control circuit performs a first refresh control operation to activate a refresh operation in all of the memory banks when an auto refresh command is supplied, and performs a second refresh control operation to activate a refresh operation in a part of the memory banks when a self refresh command is supplied.

17 Claims, 15 Drawing Sheets

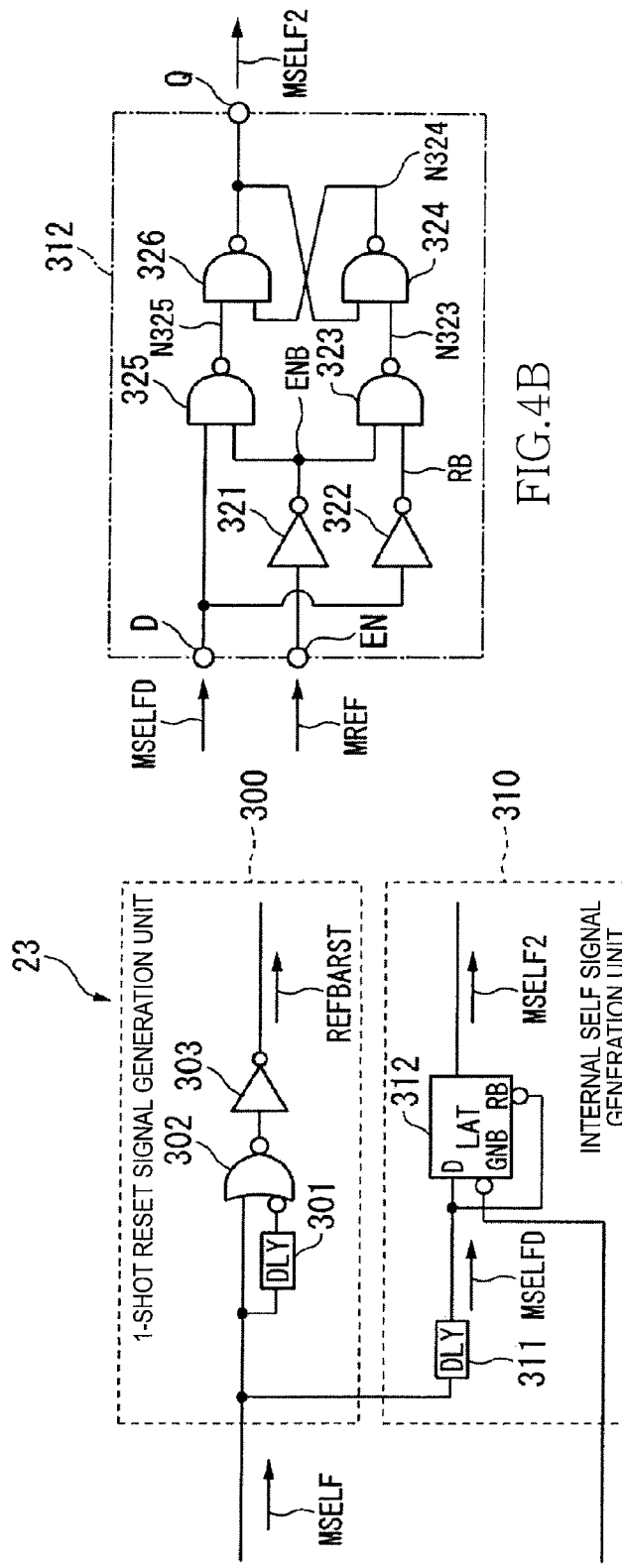

SEMICONDUCTOR DEVICE PERFORMING SELF REFRESH OPERATION

BACKGROUND OF THE INVENTION

1. Field of the Invention

The present invention relates to a semiconductor device, and more specifically to a semiconductor device including a refresh control circuit.

2. Description of Related Art

Semiconductor devices such as a dynamic random access memory (DRAM) need periodic refresh operation for the sake of maintaining the content stored in memory cells. Such a semiconductor device performs auto refresh operation when an auto refresh command (REF command) is supplied to the semiconductor device. The semiconductor device performs self-refresh operation when a self-refresh command (SELF command) is input (Japanese Patent Application Laid-Open Nos. H5-2872 and H6-275071).

When a REF command is supplied, a semiconductor device typically activates certain word lines in all memory banks constituting the semiconductor device with predetermined periods of delay between the memory banks. Specifically, when a REF command is supplied, the semiconductor device converts the REF command into refresh activation signals REFACT for controlling the activation of word lines and the activation of sense amplifiers in the respective memory banks. The refresh activation signals REFACT are supplied to the memory banks with time differences therebetween. All the memory banks perform a refresh operation (referred to as a first refresh control operation) based on the respective input refresh activation signals REFACT.

When a SELF command is supplied, the semiconductor device converts the SELF command into refresh activation signals REFACT and performs the first refresh control operation. When a SELF command is supplied, the semiconductor device also makes an internal oscillator produce self-excited oscillations. The oscillator periodically generates a refresh control signal. Based on the refresh control signals generated by the oscillator, the semiconductor device outputs the refresh activation signals REFACT to all the memory banks with time differences as in the first refresh control operation. All the memory banks each activate certain word lines in the memory bank and perform a refresh operation as with the first refresh control operation. In other words, when a SELF command is supplied, the semiconductor device initially performs the first refresh control operation like when a REF command is supplied. The semiconductor device then repeats the first refresh control operations based on the refresh control signal which the oscillator periodically generates.

The foregoing semiconductor device can reduce peaks of the power supply current supplied to the entire semiconductor device by activating certain word lines in all the memory banks with predetermined periods of delay between the respective memory banks. However, there has been a problem that the peak value of the power supply current in self-refresh operation is the same as in auto refresh operation since the first refresh control operation is repeated even in self refresh operation.

To terminate self refresh operation, a self refresh exit command (SELF Exit command) needs to be supplied to the semiconductor device. During self refresh operation, the semiconductor device performs the first refresh control operation based on the refresh control signal periodically generated by the oscillator as described above. When a SELF Exit command is supplied to the semiconductor device in time with the generation of the refresh control signal by the oscillator, then the semiconductor device completes the first refresh control operation before ending self refresh operation. As mentioned above, the first refresh control operation refreshes all the memory banks with delays. The termination of self refresh operation therefore lags as much as the delay times that are set to shift the start times of refresh operations between the memory banks. There has thus been a problem that the time (exit time from self refresh) between when a SELF Exit command is supplied to the semiconductor device and when the semiconductor device ends self refresh operation and it becomes possible to accept a next command is long.

SUMMARY

In one embodiment, there is provided a semiconductor device that includes: a plurality of memory banks each of which performs a refresh operation on a plurality of memory cells included therein when an associated one of refresh activation signals is activated; and a refresh control circuit that performs a first refresh control operation when an auto refresh command is issued and performs a second refresh control operation when a self refresh command is issued, the refresh control circuit activating all the refresh activation signals during the first refresh control operation, and the refresh control circuit activating a part of the refresh activation signals without activating remaining one or ones of the refresh activation signals during the second refresh control operation.

In another embodiment, there is provided a semiconductor device that includes: a plurality of memory banks each including a plurality of memory cells, the memory banks performing a refresh operation on the memory cells included therein in response to an associated one of refresh activation signals; an oscillator that repeatedly activates a refresh control signal at predetermined cycles when a first refresh command is once issued; and a refresh control circuit that activates a first number of the refresh activation signals when the first refresh command is issued, and activates a second number of the refresh activation signals each time the refresh control signal is activated, the second number being smaller than the first number.

In the present invention, the refresh control circuit outputs a refresh activation signal refreshing all of memory banks to each of memory bank in the first refresh control operation. When a SELF command (self refresh command) is received, the refresh control circuit outputs the refresh activation signal refreshing fewer number of memory banks to those memory banks.

Since the number of memory banks refreshed in the second refresh control operation is fewer than that of memory banks refreshed in the first refresh control operation, the peak of current in the repeated second refresh control operation can be reduced under the case of the first refresh control operation and the peak of current in the semiconductor device can be reduced.

Since all of the memory banks are not refreshed in the second refresh operation, the delay set for deviating the start timings of refresh among memory banks and the Exit period for the self refresh can be shortened.

BRIEF DESCRIPTION OF THE DRAWINGS

The above and other features and advantages of the present invention will be more apparent from the following description of certain preferred embodiments taken in conjunction with the accompanying drawings, in which:

FIG. 4A is a circuit diagram showing the configuration of the SELF state generation circuit 23 shown in FIG. 1;

FIG. 4B is a circuit diagram of a latch circuit 312 shown in FIG. 4A;

FIG. 4C shows a truth table for essential signals and the like of the latch circuit 312 shown in FIG. 4A;

DETAILED DESCRIPTION OF THE EMBODIMENT

Hereinafter, a preferred embodiment of the present invention will be described in detail with reference to the accompanying drawings.

Figure 1:
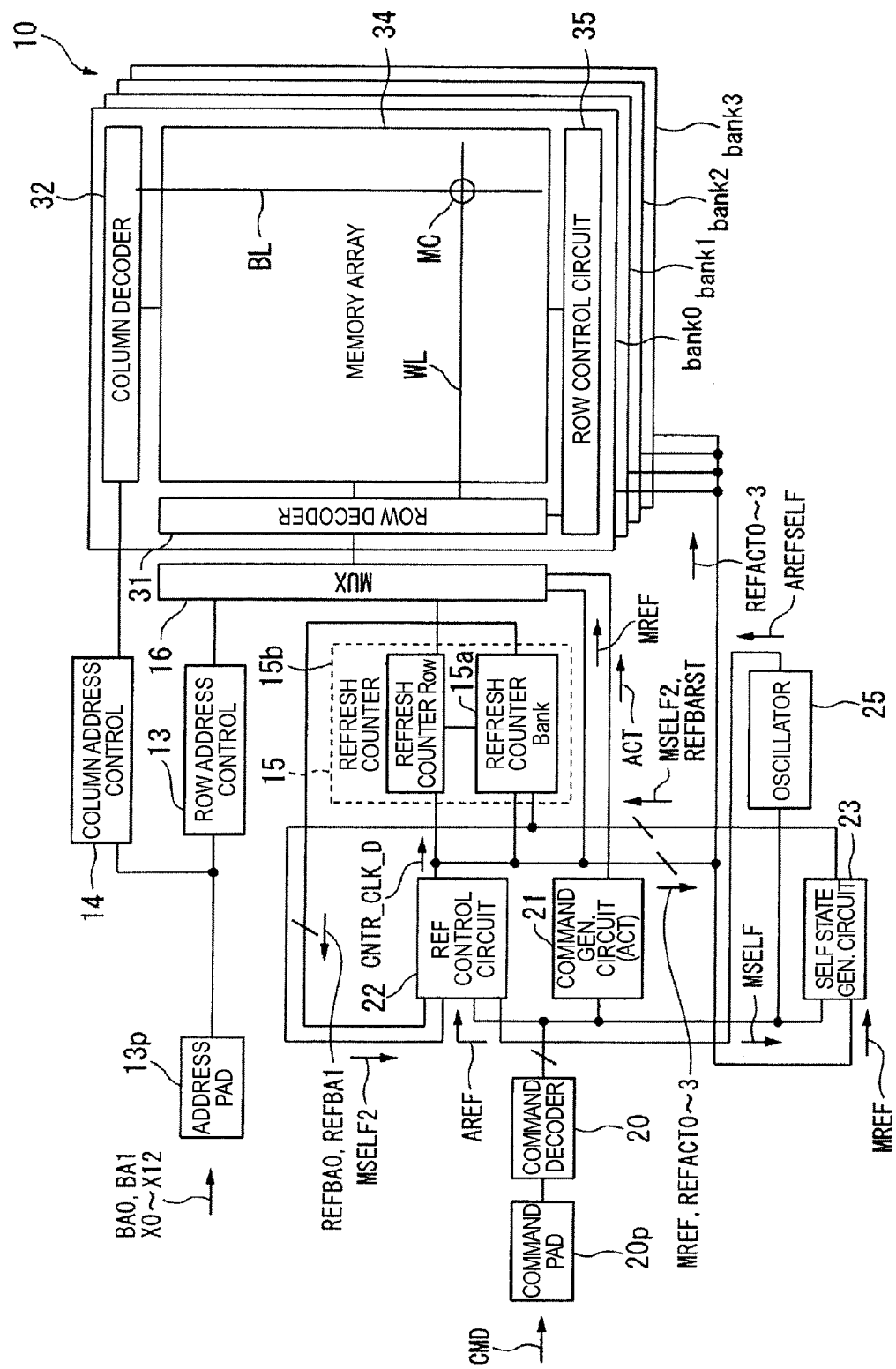
FIG. 1 is a block diagram of a semiconductor device 10 according to an embodiment of the present invention.

FIG. 1 shows a schematic configuration of a semiconductor device 10, where the present invention is applied to a semiconductor device such as a synchronous dynamic random access memory (SDRAM) which operates in synchronization with a clock signal supplied from outside. All the circuit blocks shown in FIG. 1 are formed on the same semiconductor chip which is made of monocrystalline silicon. Each of circuit block includes a plurality of transistors such as P-channel MOS transistors (PMOS transistors) and N-channel MOS transistors (NMOS transistors).

The semiconductor device 10 includes a row address control 13, a column address control 14, a refresh counter (refresh address counter) 15, a selector 16 (multiplexer: MUX), a command decoder 20, a command generation circuit 21, a REF control circuit 22 (refresh control circuit), a SELF state generation circuit 23, and an oscillator 25. The semiconductor device 10 also has four memory banks (memory banks bank0 to bank3) each including a row decoder 31, a column decoder 32, a memory array 34, and a row control circuit 35.

The REF control circuit 22 is one of characteristic parts of the semiconductor device 10 according to the present invention. The REF control circuit 22 outputs refresh activation signals REFACT0 to REFACT3 to the memory banks bank0 to bank3, respectively, according to a refresh control signal AREF and a refresh control signal MSELF output from the command decoder 20. The memory banks bank0 to bank3 include the respective row control circuits 35. Based on the refresh activation signals REFACT, the row control circuits 35 control the row decoders 31 to activate word lines WL, select memory cells MC, and read data of the memory cells MC to bit lines BL. After a lapse of a predetermined period since the activation of the word lines WL, the row control circuits 35 drive not-shown sense amplifiers to perform an amplifying operation on the potentials of the bit lines BL. The row control circuits 35 thereby perform a data rewrite operation (refresh operation) on the memory cells MC.

As will be described later, the command decoder 20 generates the refresh control signal AREF (first refresh control signal) and the refresh control signal MSELF (second refresh control signal) when a SELF command (self refresh command) is input from outside. In a first refresh control operation, the REF control circuit 22 generates as many (i.e., four) control signals CNTR_CLK_D as the number of memory banks bank0 to bank3 according to the refresh control signal AREF. Based on the control signals CNTR_CLK_D, the REF control circuit 22 delays the refresh activation signals REFACT0 to REFACT3 in order and outputs the resultant to the row control circuits 35 of the respective corresponding memory banks bank0 to bank3. The memory banks bank0 to bank3 perform the foregoing refresh operation with time differences.

When the refresh control signal MSELF is input, the oscillator 25 (timer) produces self-excited oscillations and periodically generates a refresh control signal AREFSELF. In a second refresh control operation, the REF control circuit 22 generates fewer (in the present embodiment, one) control signals CNTR_CLK_D than the number of memory banks bank0 to bank3 according to the refresh control signal AREFSELF.

Based on the control signal CNTR_CLK_D, the REF control circuit 22 outputs one of the refresh activation signals REFACT0 to REFACT3 to the row control circuit 35 of the memory bank for the refresh activation signal to be input to. The one of the memory banks bank0 to bank3 performs a refresh operation.

Such a refresh operation will be described in detail later. An overview of the semiconductor device 10 will initially be given below.

The semiconductor device 10 has address pads 13p and command pads 20p as external terminals. The semiconductor device 10 also has other terminals such as clock terminals, data input/output terminals, power supply terminals, data strobe terminals, and a reset terminal. Such terminals are omitted in the drawings.

Examples of the command pads 20p are ones to which a row address strobe signal /RAS, a column address strobe signal /CAS, a chip select signal /CS, and a write enable signal /WEN are supplied, respectively. Such pads are referred to collectively as command pads 20p. As employed herein, a signal having a signal name with a leading "/" represents either the inverted signal of a corresponding signal or a low-active signal.

A command signal CMD is composed of a combination of signals input to the command pads 20p. The command signal CMD is input to the command decoder 20. The command decoder 20 retains, decodes, and/or otherwise processes the command signal CMD to generate various types of internal command signals (including the refresh control signal AREF and the refresh control signal MSELF in the present embodiment). Among the generated internal command signals, the refresh control signal AREF is supplied to the REF control circuit 22. The refresh control signal MSELF is supplied to the SELF state generation circuit 23 and the oscillator 25.

The address pads 13p are terminals to which an address signal ADD (a bank address BA0 to BA1, a row address X0 to X12, and a column address) is supplied. In a normal operation (operation of writing data to memory cells MC or reading data from memory cells MC), the supplied address signal ADD is supplied to the row address control 13 and the column address control 14. The output of the row address control 13 is input to the selector 16. The output of the refresh counter 15 to be described later is also input to the selector 16.

When a read command or a write command is supplied to the command decoder 20, the command generation circuit 21 supplies various types of internal command signals to circuits that perform operations of reading data from memory cells and writing data to memory cells. The foregoing internal command signals output from the command decoder 20 include various types of such internal command signals. In the present embodiment, those internal command signals will be omitted since the semiconductor device 10 is not characterized by the operation of reading data from memory cells or writing data to memory cells. Note that the internal command signals include an internal act signal. When the internal act signal is input to the command generation circuit 21, the command generation circuit 21 outputs an act signal ACT to the selector 16. When the act signal is input to the selector 16, the selector 16 outputs to the row decoders 31 a row address that is input from outside through the row address control 13.

In the present embodiment, when the refresh control signal MREF output from the REF control circuit 22 is input to the selector 16, the selector 16 selects the output of the refresh counter 15 from between the output of the row address control 13 and the output of the refresh counter 15. The selector 16 then outputs internal address signals for selecting word lines to the row decoders 31 of the respective memory banks bank0 to bank3.

In the present embodiment, the semiconductor device 10 includes the memory banks bank0 to bank3. A memory bank includes a memory array 34 which includes a plurality of word lines, a plurality of bit lines, and a plurality of memory cell arrays each composed of a plurality of memory cells formed at the intersections of word lines and bit lines. A memory bank refers to a unit capable of independent operations such as a read operation, a write operation, and refresh on memory cells. For example, when an active command is input to the command decoder 20, the memory bank bank0 is activated to perform an operation according to an act command (sense operation). Here, the memory bank bank1 is not allowed to receive another command and perform an operation according to the command simultaneously with the memory bank bank0 since the command decoder 20, data input/output circuits, and the like are shared among the memory banks. However, the memory bank bank1 can be activated and perform an operation according to an active command when the active command is input to the command decoder 20 in a period between when the memory bank bank0 receives an active command and when the memory bank bank0 receives a read command corresponding to a data read operation or a write command corresponding to a data write operation, or in a period after the reception of such commands.

The memory banks bank0 to bank3 each include the row control circuit 35, the row decoder 31, and the column decoder 32.

The row decoders 31 select word lines WL in the memory banks bank0 to bank3. In a normal operation, the row decoders 31 select word lines whose locations are specified by a row address X0 to X12 input to the address pads 13p, based on an address input from the row address control 13. When a REF command or SELF command is input to the command decoder 20, the row decoders 31 select word lines based on an internal row address output from the refresh counter 15.

The output of the column address control 14 is supplied to the column decoders 32. The column decoders 32 select sense amplifiers in the memory banks bank0 to bank3 in a normal operation. In a normal operation, the sense amplifiers selected by the column decoders 32 are connected to a not-shown data amplifier, for example. In a read operation, the data amplifier further amplifies read data amplified by the sense amplifiers, and outputs the resultant to outside the semiconductor device through a read/write bus and a data input/output circuit. In a write operation, the data amplifier amplifies write data input from a data input/output circuit through the read/write bus, and supplies the resultant to the sense amplifiers. Note that when a REF command or SELF command is input to the command decoder 20, the operations of writing data to memory cells and reading data from memory cells through the column decoders 32 are not necessarily needed, and the column address control 14 and the column decoders 32 need not be operated.

When the refresh activation signals REFACT0 to REFACT3 are input from the REF control circuit 22 to the row control circuits 35 of the respective memory banks bank0 to bank3, the row control circuits 35 activate the row decoders 31 to select word lines. The row control circuits 35 then activate sense amplifiers to refresh memory cells connected to the selected word lines.

In the present embodiment, when a REF command is input to the command decoder 20, the refresh activation signals REFACT0 to REFACT3 are input from the REF control circuit 22 to the row control circuits 35 of the respective memory banks bank0 to bank3 with time differences between the memory banks. The row control circuits 35 then perform a first refresh control operation, shifting refresh operations from one memory bank to another. When a SELF command is input to the command decoder 20, the refresh activation signals REFACT0 to REFACT3 are input from the REF control circuit 22 to the row control circuits 35 of the respective memory banks bank0 to bank3 in succession with time differences between the memory banks. The row control circuits 35 thus initially performs a first refresh control operation. Subsequently, after a lapse of time that is determined by the cycle of the refresh control signal AREFSELF output from the oscillator 25, the row control circuit 35 of the first memory bank bank0 among the memory banks bank0 to bank3 performs a second refresh control operation. In the second refresh control operation, the internal row address output from the refresh counter 15 to be described later is incremented by one as compared to the previous first refresh control operation. Assuming that a word line WL0 is selected in the first refresh control operation, the memory bank bank0 then selects the next word line WL1. In the second refresh control operation, the other three memory banks bank1 to bank3 are in an idle state (standby state).

The refresh control signal AREFSELF occurs periodically until a SELF Exit command is input to the command decoder 20.

Take, for example, the case where the semiconductor device 10 enters self refresh and the refresh control signal AREFSELF occurs six times consecutively. Initially, word lines (referred to as WLi) of the four memory banks bank0 to bank3 are selected with time differences, and memory cells connected to the word lines WLi of the memory banks bank0 to bank3 are refreshed (first refresh control operation). Subsequently, word lines WLj (j=i+1) of the four memory banks bank0 to bank3 and word lines WLk (k=j+1) of two memory banks bank0 and bank1 are selected in order at respective cycles of the refresh control signal AREFSELF, whereby memory cells connected to the word lines WLj and word lines WLk are refreshed.

It will be understood that while the present embodiment deals with the four memory banks bank0 to bank3, the number of memory banks is not limited to four. For example, the number of memory banks may be eight or sixteen.

Next, the configuration of the REF control circuit 22, the refresh counter 15, and the SELF state generation circuit 23 shown in FIG. 1 will be described in order with reference to the drawings.

Figure 2:
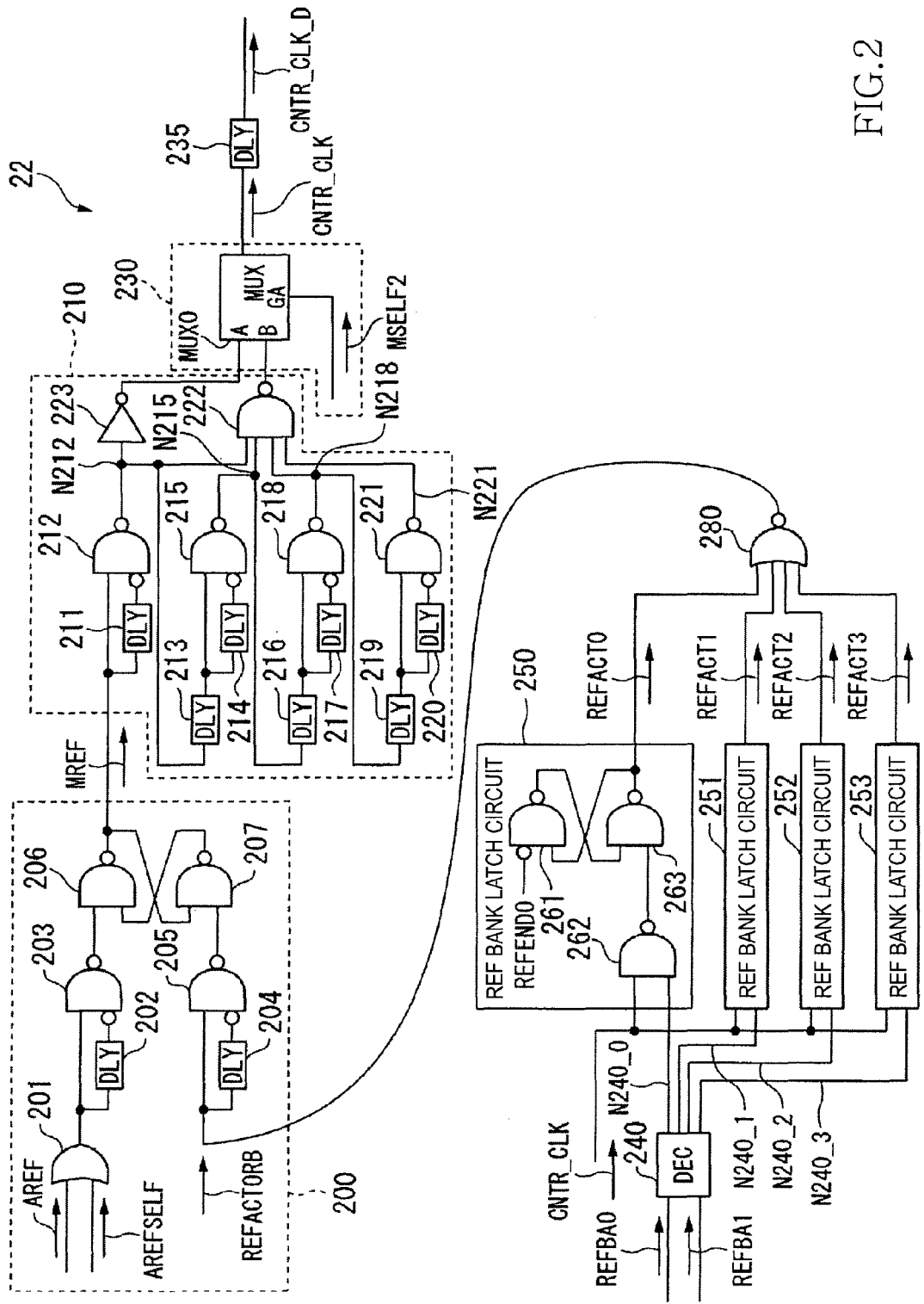
FIG. 2 is a circuit diagram of the REF control circuit (refresh control circuit) shown in FIG. 1.

FIG. 2 is a circuit diagram showing the configuration of the REF control circuit 22 shown in FIG. 1.

As shown in FIG. 2, the REF control circuit 22 includes an MREF signal generation circuit 200, a pulse signal generation circuit 210, a selector 230, a delay circuit 235, a decoder 240, REF BANK latch circuits 250 to 253, and a NOR circuit 280.

(Configuration of MREF Signal Generation Circuit 200)

The MREF signal generation circuit 200 includes an OR circuit 201, a delay circuit 202, a logic circuit 203, a delay circuit 204, a logic circuit 205, a NAND circuit 206, and a NAND circuit 207.

The OR circuit 201 is a two-input one-output OR circuit. The refresh control signal AREF (first refresh control signal) is input to either one (first input) of the two inputs of the OR circuit 201. The refresh control signal AREFSELF (third refresh control signal) output from the oscillator 25 shown in FIG. 1 is input to the other input (second input). The refresh control signal AREFSELF is a signal that the oscillator 25 shown in FIG. 1 periodically generates at self refresh cycles, i.e., at the cycles of the second refresh control operation when the refresh control signal MSELF (second refresh control signal) is input from the command decoder 20.

The OR circuit 201 outputs an output signal of H level to the delay circuit 202 and the logic circuit 203 when at least either one of the refresh control signal AREF and the refresh control signal AREFSELF becomes an H level.

The input of the delay circuit 202 is connected to the output of the OR circuit 201. The output of the delay circuit 202 is connected to a second input of the logic circuit 203. The delay circuit 202 delays the output signal of the OR circuit 201 and outputs the delayed signal to the logic circuit 203.

The logic circuit 203 is a two-input one-output logic circuit. A first input of the logic circuit 203 is connected to the output of the OR circuit 201, and the second input is connected to the output of the delay circuit 202. The output of the logic circuit 203 is connected to a first input of the NAND circuit 206. The logic circuit 203 outputs an output signal of L level when the first input is at an H level and the second input is at an L level. The logic circuit 203 outputs an output signal of H level when the first input is at an L level or the second input is at an H level.

When the OR circuit 201 outputs an output signal of H level, the logic circuit 203 outputs an output signal of L level to the first input of the NAND circuit 206 because the output of the delay circuit 202 here is at an L level.

The input of the delay circuit 204 is connected to the output of the NOR circuit 280. The output of the delay circuit 204 is connected to a second input of the logic circuit 205. The delay circuit 204 delays an output signal REFACTORB of the NOR circuit 280 and outputs the delayed signal to the logic circuit 205.

The logic circuit 205 is a two-input one-output logic circuit. A first input of the logic circuit 205 is connected to the output of the NOR circuit 280, and the second input is connected to the output of the delay circuit 204. The output of the logic circuit 205 is connected to a second input of the NAND circuit 207.

The logic circuit 205 outputs an output signal of L level when the first input is at an H level and the second input is at an L level. The logic circuit 205 outputs an output signal of H level when the first input is at an L level or the second input is at an H level.

When the NOR circuit 280 outputs the output signal REFACTORB of H level, the logic circuit 205 outputs an output signal of L level to the second input of the NAND circuit 207 because the output of the delay circuit 204 here is at an L level.

The NAND circuit 206 is a two-input one-output negative AND circuit. The first input of the NAND circuit 206 is connected to the output of the logic circuit 203. A second input of the NAND circuit 206 is connected to the output of the NAND circuit 207. The output of the NAND circuit 206 is connected to a first input of a logic circuit 212 and a delay circuit 211 in the pulse signal generation circuit 210.

The NAND circuit 207 is a two-input one-output negative AND circuit. A first input of the NAND circuit 207 is connected to the output of the NAND circuit 206, and the second input is connected to the output of the logic circuit 205. The output of the NAND circuit 207 is connected to the second input of the NAND circuit 206.

The NAND circuit 206 outputs the refresh control signal MREF of H level to the first input of the logic circuit 212 and the delay circuit 211 when the logic circuit 203 outputs an output signal of L level. When the output of the logic circuit 205 here is at an H level, the NAND circuit 207 outputs an output signal of L level to the second input of the NAND circuit 206. Consequently, the NAND circuit 206 continues outputting the refresh control signal MREF of H level even if the output of the logic circuit 203 returns to an H level. In other words, the flip-flop constituted by the NAND circuits 206 and 207 retains the H level of the refresh control signal MREF.

Subsequently, when the NOR circuit 280 outputs the output signal REFACTORB of H level, the output of the logic circuit 205 becomes an L level and the output of the NAND circuit 207 becomes an H level. Consequently, the NAND circuit 206 outputs the refresh control signal MREF of L level when the output of the logic circuit 203 is at an H level.

With such a circuit configuration, the MREF signal generation circuit 200 sets the refresh control signal MREF (fourth refresh control signal) to an H level (active level) when either one of the refresh control signal AREF (first refresh control signal) and the refresh control signal AREFSELF (third refresh control signal) becomes an H level.

Here, the output signal REFACTORB of the NOR circuit 280 is at an H level. The output of the delay circuit 204 is at an H level. The output signal of the logic circuit 205 is at an H level. Consequently, the output signal of the NAND circuit 207 becomes an L level. The NAND circuit 206 maintains the refresh control signal MREF at the H level even if both the refresh control signal AREF and the refresh control signal AREFSELF become an L level and the output signal of the logic circuit 203 becomes an H level.

Subsequently, the output signal REFACTORB of the NOR circuit 280 becomes an L level as will be described later. Since the output signal of the logic circuit 205 is maintained at an H level, the NAND circuit 206 maintains the refresh control signal MREF at the H level.

When the NOR circuit 280 changes the output signal REFACTORB to an H level, the output signal of the logic circuit 205 becomes an L level and the output signal of the NAND circuit 207 an H level. Both the refresh control signal AREF and the refresh control signal AREFSELF become an L level, and the output signal of the logic circuit 203 becomes an H level. Consequently, the NAND circuit 206 changes the refresh control signal MREF to an L level.

(Configuration of Pulse Signal Generation Circuit 210)

The pulse signal generation circuit 210 includes the delay circuit 211, the logic circuit 212, a delay circuit 213, a delay circuit 214, a logic circuit 215, a delay circuit 216, a delay circuit 217, a logic circuit 218, a delay circuit 219, a delay circuit 220, a logic circuit 221, a NAND circuit 222, and an inverter circuit 223 (logic inversion circuit).

The input of the delay circuit 211 is connected to the output of the NAND circuit 206 in the MREF signal generation circuit 200. The output of the delay circuit 211 is connected to a second input of the logic circuit 212. The delay circuit 211 delays the refresh control signal MREF and outputs the delayed signal to the logic circuit 212.

The logic circuit 212 is a two-input one-output logic circuit. The first input of the logic circuit 212 is connected to the output of the NAND circuit 206 of the MREF signal generation circuit 200, and the second input is connected to the output of the delay circuit 211. The output of the logic circuit 212 is connected to the input of the delay circuit 213, a first input of the NAND circuit 222, and the input of the inverter circuit 223 through a node N212.

The logic circuit 212 sets the node N212 to an L level when the first input is at an H level and the second input is at an L level. The logic circuit 212 sets the node N212 to an H level when the first input is at an L level or the second input is at an H level.

When the refresh control signal MREF input to the first input of the logic circuit 212 becomes an H level, the logic circuit 212 changes the node N212 from an H level to an L level because the output of the delay circuit 211 here is at an L level. When the output of the delay circuit 211 becomes an H level, the logic circuit 212 changes the node N212 from an L level to an H level.

The input of the delay circuit 213 is connected to the output of the logic circuit 212 through the node N212. The output of the delay circuit 213 is connected to the input of the delay circuit 214 and a first input of the logic circuit 215. The delay circuit 213 delays the output of the logic circuit 212 and outputs the delayed signal to the logic circuit 215.

The input of the delay circuit 214 is connected to the output of the delay circuit 213. The output of the delay circuit 214 is connected to a second input of the logic circuit 215. The delay circuit 214 delays the output of the delay circuit 213 and outputs the delayed signal.

The logic circuit 215 is a two-input one-output logic circuit. The first input of the logic circuit 215 is connected to the output of the delay circuit 213, and the second input is connected to the output of the delay circuit 214. The output of the logic circuit 215 is connected to the input of the delay circuit 216 and a second input of the NAND circuit 222 through a node N215.

The logic circuit 215 sets the node N215 to an L level when the first input is at an H level and the second input is at an L level. The logic circuit 215 sets the node N215 to an H level when the first input is at an L level or the second input is at an H level.

When the output of the delay circuit 214 input to the second input of the logic circuit 215 becomes an L level, the logic circuit 215 changes the node N215 from an H level to an L level because the output of the delay circuit 213 here is at an H level. When the output of the delay circuit 214 becomes an H level, the logic circuit 215 changes the node N215 from an L level to an H level.

The input of the delay circuit 216 is connected to the output of the logic circuit 215 through the node N215. The output of the delay circuit 216 is connected to the input of the delay circuit 217 and a first input of the logic circuit 218. The delay circuit 216 delays the output of the logic circuit 215 and outputs the delayed signal.

The input of the delay circuit 217 is connected to the output of the delay circuit 216. The output of the delay circuit 217 is connected to a second input of the logic circuit 218. The delay circuit 217 delays the output of the delay circuit 216 and outputs the delayed signal to the logic circuit 218.

The logic circuit 218 is a two-input one-output logic circuit. The first input of the logic circuit 218 is connected to the output of the delay circuit 216, and the second input is connected to the output of the delay circuit 217. The output of the logic circuit 218 is connected to the input of the delay circuit 219 and a third input of the NAND circuit 222 through a node N218.

The logic circuit 218 sets the node N218 to an L level when the first input is at an H level and the second input is at an L level. The logic circuit 218 sets the node N218 to an H level when the first input is at an L level or the second input is at an H level.

When the output of the delay circuit 217 input to the second input of the logic circuit 218 becomes an L level, the logic circuit 218 changes the node N218 from an H level to an L level because the output of the delay circuit 216 here is at an H level. When the output of the delay circuit 217 becomes an H level, the logic circuit 218 changes the node N218 from an L level to an H level.

The input of the delay circuit 219 is connected to the output of the logic circuit 218 through the node N218. The output of the delay circuit 219 is connected to the input of the delay circuit 220 and a first input of the logic circuit 221. The delay circuit 219 delays the output of the delay circuit 218 and outputs the delayed signal.

The input of the delay circuit 220 is connected to the output of the delay circuit 219. The output of the delay circuit 220 is connected to a second input of the logic circuit 221. The delay circuit 220 delays the output of the delay circuit 219 and outputs the delayed signal to the logic circuit 221.

The logic circuit 221 is a two-input one-output logic circuit. The first input of the logic circuit 221 is connected to the output of the delay circuit 219, and the second input is connected to the output of the delay circuit 220. The output of the logic circuit 221 is connected to a fourth input of the NAND circuit 222 through a node N221.

The logic circuit 221 sets the node N221 to an L level when the first input is at an H level and the second input is at an L level. The logic circuit 221 sets the node N221 to an H level when the first input is at an L level or the second input is at an H level.

When the output of the delay circuit 220 input to the second input of the logic circuit 221 becomes an L level, the logic circuit 221 changes the node N221 from an H level to an L level because the output of the delay circuit 219 here is at an H level. When the output of the delay circuit 220 becomes an H level, the logic circuit 221 changes the node N221 from an L level to an H level.

The NAND circuit 222 is a four-input one-output negative AND circuit. The first input of the NAND circuit 222 is connected to the output of the logic circuit 212 through the node N212. The second input is connected to the output of the logic circuit 215 through the node N215. The third input is connected to the output of the logic circuit 218 through the node N218. The fourth input is connected to the output of the logic circuit 221 through the node N221. The output of the NAND circuit 222 is connected to a B terminal of the selector 230.

The input of the inverter circuit 223 (logic inversion circuit) is connected to the output of the logic circuit 212 through the node N212. The output of the inverter circuit 223 is connected to an A terminal of the selector 230.

With such a circuit configuration, the pulse signal generation circuit 210 outputs as many pulses as the number of memory banks (in the present embodiment, four in the presence of the memory banks bank0 to bank3) from the NAND circuit 222 when the refresh control signal MREF (fourth refresh control signal) becomes an H level (active level).

Figure 3:
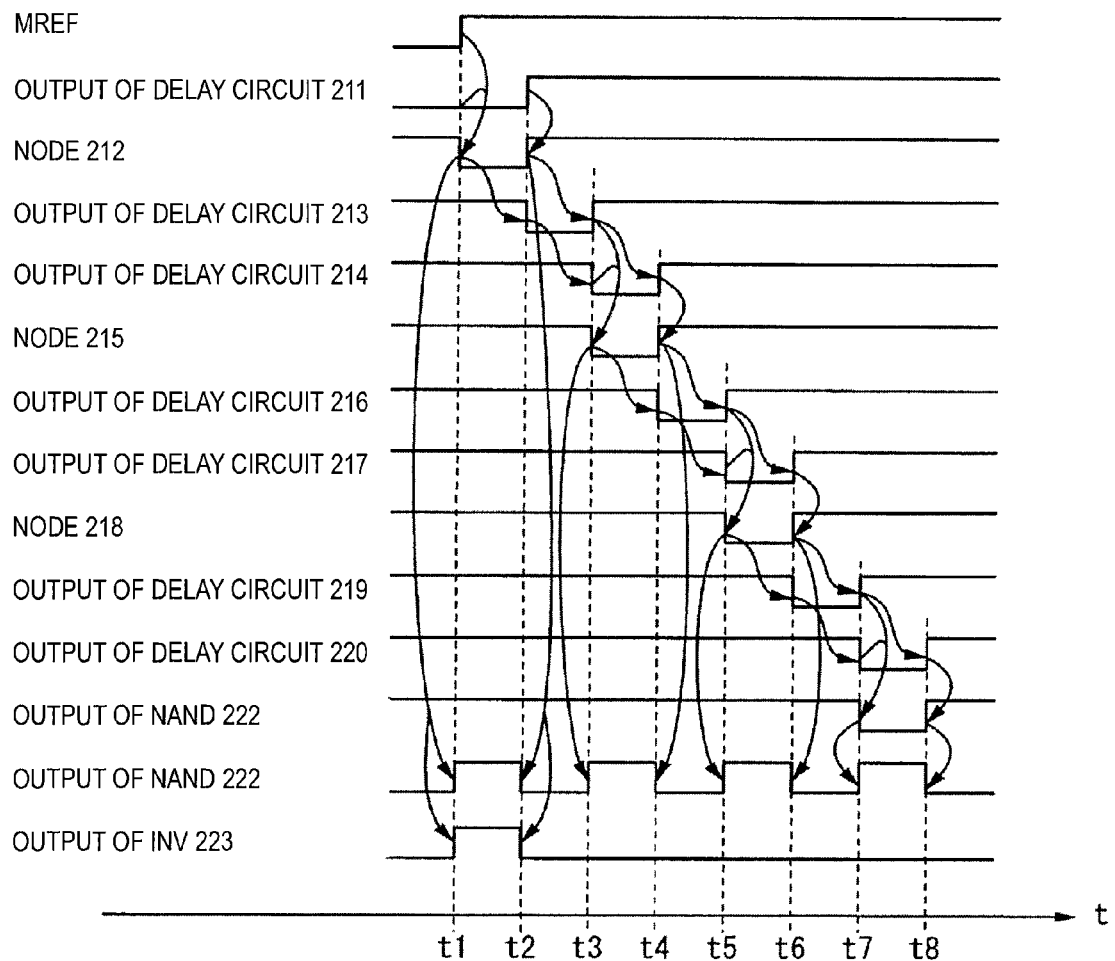
FIG. 3 is a schematic diagram to explain for the pulse signal generation circuit 210 shown in FIG. 2.

FIG. 3 is an operation timing chart of the pulse signal generation circuit 210. FIG. 3 shows changes of the outputs of the foregoing delay circuits over time and changes of the nodes over time.

At time t1, the MREF signal generation circuit 200 changes the refresh control signal MREF to an H level. Since the output of the delay circuit 211 is at an L level, the logic circuit 212 changes the node N212 from an H level to an L level. This changes the output of the NAND circuit 222 and the output of the inverter circuit 223 (INV 223) from an L level to an H level.

At time t2, the delay circuit 211 changes its output to an H level. The logic circuit 212 changes the node N212 from an L level to an H level. This changes the output of the NAND circuit 222 and the output of the inverter circuit 223 (INV 223) from an H level to an L level.

The output of the delay circuit 213 also changes from an H level to an L level.

At time t3, the delay circuit 213 changes its output to an H level and the delay circuit 214 changes its output to an L level. The logic circuit 215 changes the node N215 from an H level to an L level. This changes the output of the NAND circuit 222 from an L level to an H level.

At time t4, the delay circuit 214 changes its output to an H level. The logic circuit 215 changes the node N215 from an L level to an H level. This changes the output of the NAND circuit 222 from an H level to an L level.

At time t5, the delay circuit 216 changes its output to an H level and the delay circuit 217 changes its output to an L level. The logic circuit 218 changes the node N218 from an H level to an L level. This changes the output of the NAND circuit 222 from an L level to an H level.

At time t6, the delay circuit 217 changes its output to an H level. The logic circuit 218 changes the node N218 from an L level to an H level. This changes the output of the NAND circuit 222 from an H level to an L level.

At time t7, the delay circuit 219 changes its output to an H level and the delay circuit 220 changes its output to an L level. The logic circuit 221 changes the node N221 from an H level to an L level. This changes the output of the NAND circuit 222 from an L level to an H level.

At time t8, the delay circuit 220 changes its output to an H level. The logic circuit 221 changes the node N221 from an L level to an H level. This changes the output of the NAND circuit 222 from an H level to an L level.

As described above, the pulse signal generation circuit 210 outputs four pulses, as many as the number of memory banks, from the NAND circuit 222 to the B terminal of the selector 230 when the refresh control signal MREF (fourth refresh control signal) becomes an H level (active level). As shown in FIG. 3, the pulse signal generation circuit 210 outputs a pulse from the inverter circuit 223 to the A terminal of the selector 230 simultaneously with the output of the first pulse from the NAND circuit 222.

Returning to FIG. 2, the selector 230 includes a multiplexer MUX0.

A refresh control signal MSELF2 is input to a gate terminal GA of the multiplexer MUX0. The multiplexer MUX0 connects either one of the A terminal and the B terminal to its output terminal depending on the logic of the refresh control signal MSELF2. The output terminal of the multiplexer MUX0 is the output terminal of the selector 230. The output terminal is connected to the input of the delay circuit 235.

Specifically, when the refresh control signal MSELF2 is at an H level, the multiplexer MUX0 connects the A terminal to the output terminal. When the refresh control signal MSELF2 is at an L level, the multiplexer MUX0 connects the B terminal to the output terminal. Consequently, when the refresh control signal MSELF2 is at an H level, the selector 230 outputs the single pulse output from the inverter circuit 223 of the pulse signal generation circuit 210 to the delay circuit 235 in the subsequent stage and to the REF BANK latch circuits 250 to 253 as a control signal CNTR_CLK. When the refresh control signal MSELF2 is at an L level, the selector 230 outputs the four pulses output from the NAND circuit 222 of the pulse signal generation circuit 210 to the delay circuit 235 in the subsequent stage and to the REF BANK latch circuits 250 to 253 as the control signal CNTR_CLK.

The input of the delay circuit 235 is connected to the output terminal of the selector 230. The output of the delay circuit 235 is connected to the refresh counter 15 shown in FIG. 1. The delay circuit 235 delays the control signal CNTR_CLK and outputs the delayed signal (control signal CNTR_CLK_D) to the refresh counter 15. The refresh counter 15 uses the control signal CNTR_CLK_D as a clock signal for counting up a counter (a detailed description will be given later).

The decoder 240 is a two-input four-output decoder. The two inputs of the decoder 240 are connected to a refresh counter bank 15a which is included in the refresh counter 15. An internal bank address REFBA0 and an internal bank address REFBA1 are input to the two inputs.

The four outputs of the decoder 240 are connected to nodes N240_0 to N240_3, respectively.

The decoder 240 changes any one of the nodes N240_0 to N240_3 from an L level to an H level depending on combinations of "0"s (L level) and "1"s (H level) of the internal bank address REFBA0 and the internal bank address REFBA1, i.e., "00," "10," "01," and "11." Examples will be given below.

When (REFBA0,REFBA1)="00," the decoder 240 changes the node N240_0 from an L level to an H level. When (REFBA0,REFBA1)="10," the decoder 240 changes the node N240_1 from an L level to an H level. When (REFBA0, REFBA1)="01," the decoder 240 changes the node N240_2 from an L level to an H level. When (REFBA0,REFBA1)= "11," the decoder 240 changes the node N240_3 from an L level to an H level.

The REF BANK latch circuits 250 to 253 are circuits that are provided for the memory banks bank0 to bank3, respectively. The REF BANK latch circuits 250 to 253 change the refresh activation signals REFACT0 to REFACT3 to an active level (H level), respectively, based on the outputs of the decoder 240 and the output of the selector 230 (control signal CNTR_CLK). The REF BANK latch circuits 250 to 253 output the refresh activation signals REFACT0 to REFACT3 of the active level to the row control circuits 35 in the memory banks bank0 to bank3, respectively. As mentioned previously, a row, control circuit 35 to which a refresh activation signal REFACT of the active level is input controls the row decoder 31 and sense amplifiers to perform a refresh operation on selected memory cells on the memory bank.

The REF BANK latch circuits 250 to 253 have the same circuit configuration, whereas respective different decode signals are input from the decoder 240 and respective different refresh end signals REFEND are fed back from the memory banks. The configuration and operation of the REF BANK latch circuit 250 will be described below.

The REF BANK latch circuit 250 includes a logic circuit 261, a NAND circuit 262, and a NAND circuit 263.

The logic circuit 261 is a two-input one-output logic circuit. A first input of the logic circuit 261 is connected to the row control circuit 35 in the memory bank bank0. A second input of the logic circuit 261 is connected to the output of the NAND circuit 263. The output of the logic circuit 261 is connected to a first input of the NAND circuit 263.

The logic circuit 261 outputs an output signal of L level to the first input of the NAND circuit 263 when the refresh end signal REFEND0 input to the first input of the logic circuit 261 is at an L level and the refresh activation signal REFACT0 input to the second input is at an H level.

The NAND circuit 262 is a two-input one-output negative AND circuit. A first input of the NAND circuit 262 is connected to the output of the selector 230. A second input of the NAND circuit 262 is connected to the decoder 240 through the node N240_0. The output of the NAND circuit 262 is connected to a second input of the NAND circuit 263.

The NAND circuit 262 outputs an output signal of L level to the second input of the NAND circuit 263 when the control signal CNTR_CLK input to the first input of the NAND circuit 262 is at an H level and the output signal of the decoder 240 input to the second input (the level of the node N240_0) is at an H level.

The NAND circuit 263 is a two-input one-output negative AND circuit. The first input of the NAND circuit 263 is connected to the output of the logic circuit 261, and the second input is connected to the output of the NAND circuit 262. The output of the NAND circuit 263 is connected to a first input of the NOR circuit 280.

The NAND circuit 263 outputs the refresh activation signal REFACT0 of H level to the NOR circuit 280 when the NAND circuit 262 outputs an output signal of L level. When the refresh end signal REFEND0 is at an L level, the logic circuit 261 outputs an output signal of L level to the first input of the NAND circuit 263. Consequently, the NAND circuit 263 continues outputting the refresh activation signal REFACT0 of H level even if the output of the NAND circuit 262 returns to an H level. In other words, the flip-flop constituted by the logic circuit 261 and the NAND circuit 263 retains the H level of the refresh activation signal REFACT0.

Subsequently, when the row control circuit 35 of the memory bank bank0 ends the refresh control operation and outputs the refresh end signal REFEND0 of H level, the output of the logic circuit 261 becomes an H level. The pulse width of the control signal CNTR_CLK is set to be sufficiently short as compared to the time (refresh time) between when the refresh activation signal REFACT0 becomes an H level and when the refresh end signal REFEND0 becomes an L level. The pulse widths of the internal bank addresses REFBA0 and REFBA1 are also set to be sufficiently short as compared to the refresh time. Consequently, the output of the NAND circuit 262 is already at an H level, and the NAND circuit 263 changes the refresh activation signal REFACT0 from an H level to an L level.

With such a circuit configuration, the REF BANK latch circuits 250 to 253 change the refresh activation signals REFACT0 to REFACT3 from an L level to an H level (active level), respectively, based on the control signal CNTR_CLK and the outputs of the decoder 240.

When the refresh periods of the memory banks bank0 to bank3 end and the refresh end signals REFEND0 to REFEND3 become an H level, the REF BANK latch circuits 250 to 253 change the refresh activation signals REFACT0 to REFACT3 from an H level to an L level (inactive level), respectively.

The NOR circuit 280 is a four-input one-output negative OR circuit. The first input of the NOR circuit 280 is connected to the output of the REF BANK latch circuit 250. A second input of the NOR circuit 280 is connected to the output of the REF BANK latch circuit 251. A third input is connected to the output of the REF BANK latch circuit 252. A fourth input is connected to the output of the REF BANK latch circuit 253. The output of the NOR circuit 280 is connected to the input of the delay circuit 204 and the first input of the logic circuit 205 in the MREF signal generation circuit 200.

The NOR circuit 280 changes the output signal REFACTORB from an H level to an L level when any one of the refresh activation signals REFACT0 to REFACT3 becomes an H level.

As described above, the pulse width of the control signal CNTR_CLK is set to be sufficiently short as compared to the time (refresh time) between when the refresh activation signal REFACT0 becomes an H level and when the refresh end signal REFEND0 becomes an L level. Suppose that four control signals CNTR_CLK occur in succession. After a refresh activation signal, e.g., the refresh activation signal REFACT0 becomes the active level (H level), the next refresh activation signal REFACT1 also becomes an H level while the refresh activation signal REFACT0 is still at the H level. This prevents the output signal REFACTORB from repeating changing between an L level and an H level in synchronization with the control signals CNTR_CLK. The output signal REFACTORB changes from an H level to an L level when the refresh activation signal REFACT0 becomes an H level. The output signal REFACTORB changes from the L level to an H level when the refresh activation signal REFACT3 becomes an L level. Now, suppose that there occurs one control signal CNTR_CLK. When the one refresh activation signal, e.g., the refresh activation signal REFACT0 becomes the active level (H level), the output signal REFACTORB changes from an H level to an L level. The output signal REFACTORB changes from the L level to an H level when the refresh activation signal REFACT0 becomes an L level.

Consequently, as described above, the MREF signal generation circuit 200 maintains the H level of the refresh control signal MREF while the output signal REFACTORB is at an L level. The NOR circuit 280 changes the output signal REFACTORB from an L level to an H level when all the refresh activation signals REFACT0 to REFACT3 are at an L level. The MREF signal generation circuit 200 then changes the refresh control signal MREF from an H level to an L level.

(Configuration of SELF State Generation Circuit 23)

Next, the configuration of the SELF state generation circuit 23 shown in FIG. 1 will be described with reference to FIGS. 4A to 4C.

FIG. 4A is a circuit diagram showing the configuration of the SELF state generation circuit 23 shown in FIG. 1. FIG. 4B is a circuit diagram of a latch circuit 312 shown in FIG. 4A. FIG. 4C shows a truth table for essential signals and the like of the latch circuit 312.

As shown in FIG. 4A, the SELF state generation circuit 23 includes a one-shot reset signal generation unit 300 and an internal SELF signal generation unit 310.

The one-shot reset signal generation unit 300 includes a delay circuit 301, a logic circuit 302, and an inverter circuit 303.

The input of the delay circuit 301 is connected to the output of the command decoder 20 shown in FIG. 1. The output of the delay circuit 301 is connected to a second input of the logic circuit 302. The delay circuit 301 delays the refresh control signal MSELF (second refresh control signal) and outputs the delayed signal (refresh control signal MSELFD) to the logic circuit 302.

The logic circuit 302 is a two-input one-output logic circuit. A first input of the logic circuit 302 is connected to the output of the command decoder 20, and the second input is connected to the output of the delay circuit 301. The output of the logic circuit 302 is connected to the input of the inverter circuit 303. The logic circuit 302 outputs an output signal of H level when the first input is at an L level and the second input is at an H level. The logic circuit 302 outputs an output signal of L level when the first input is at an H level or the second input is at an L level.

When the refresh control signal MSELF changes from an H level to an L level, the logic circuit 302 changes its output signal from an L level to an H level because the output of the delay circuit 301 here is at an H level.

The input of the inverter circuit 303 is connected to the output of the logic circuit 302. The output of the inverter circuit 303 is connected to the refresh counter bank 15a in the refresh counter 15 shown in FIG. 1. When the output of the logic circuit 302 changes from an L level to an H level, the inverter circuit 303 outputs a counter reset signal REFBARST of one-shot form (with a short L-level period) to the refresh counter bank 15a.

In other words, when the refresh control signal MSELF changes from an H level to an L level, the one-shot reset signal generation unit 300 outputs the counter reset signal REFBARST of one-shot form (with a short L-level period) to the refresh counter bank 15a.

The internal SELF signal generation unit 310 includes a delay circuit 311 and a latch circuit 312.

The input of the delay circuit 311 is connected to the output of the command decoder 20. The output of the delay circuit 311 is connected to a D terminal of the latch circuit 312. The delay circuit 311 delays the refresh control signal MSELF and outputs the delayed signal (refresh control signal MSELFD) to the latch circuit 312.

FIG. 4B is a circuit diagram showing an example of the latch circuit 312.

The latch circuit 312 includes an inverter circuit 321, an inverter circuit 322, a NAND circuit 323, a NAND circuit 324, a NAND circuit 325, and a NAND circuit 326.

The input of the inverter circuit 321 is connected to an EN terminal. The output of the inverter circuit 321 is connected to a first input of the NAND circuit 323 and a second input of the NAND circuit 325 through an ENB terminal. The inverter circuit 321 logically inverts the refresh control signal MREF (fourth refresh control signal) and outputs the resultant to the NAND circuit 323 and the NAND circuit 325.

The input of the inverter circuit 322 is connected to the D terminal. The output of the inverter circuit 322 is connected to a second input of the NAND circuit 323 through a node RB. The inverter circuit 322 logically inverts the refresh control signal MSELFD and outputs the resultant to the NAND circuit 323.

The NAND circuit 323 is a two-input one-output negative AND circuit. The first input of the NAND circuit 323 is connected to the output of the inverter circuit 321 through the ENB terminal, and the second input is connected to the output of the inverter circuit 322 through the node RB. The output of the NAND circuit 323 is connected to a second input of the NAND circuit 324 through a node N323.

The NAND circuit 324 is a two-input one-output negative AND circuit. A first input of the NAND circuit 324 is connected to the output of the NAND circuit 326, and the second input is connected to the output of the NAND circuit 323 through the node N323. The output of the NAND circuit 324 is connected to a second input of the NAND circuit 326 through a node N324.

The NAND circuit 325 is a two-input one-output negative AND circuit. A first input of the NAND circuit 325 is connected to the D terminal, and the second input is connected to the output of the inverter circuit 321 through the ENB terminal. The output of the NAND circuit 325 is connected to a first input of the NAND circuit 326 through a node N325.

The NAND circuit 326 is a two-input one-output negative AND circuit. The first input of the NAND circuit 326 is connected to the output of the NAND circuit 325 through the node N325, and the second input is connected to the output of the NAND circuit 324 through the node N324. The output of the NAND circuit 326 is connected to a Q terminal and the first input of the NAND circuit 324.

FIG. 4C shows a truth table for the levels of essential signals and nodes of the latch circuit 312. With the foregoing configuration, the essential signals and nodes of the latch circuit 312 have the levels shown in FIG. 4C, depending on combinations of H and L levels of the refresh control signals MREF and MSELFD.

Note that the latch circuit 312 uses the refresh control signal MSELFD, not the refresh control signal MSELF. The reason is so that the state of combination 1 shown in FIG. 4C changes to the state of combination 3 via the state of combination 2 when the command decoder 20 receives a SELF command (self refresh command). The state of combination 3 shown in FIG. 4C is followed by the state of combination 4. More specifically, the refresh control signal MREF changes to an active level (H level) without changing the refresh control signal MSELF2 to an active level (H level). The refresh control signal MSELF2 changes to an H level when the refresh control signal MSELFD is at an H level when the refresh control signal MREF changes from an H level to an L level.

In the foregoing REF control circuit 22, when the refresh control signal AREF is input to output the refresh control signal MREF, the pulse signal generation circuit 210 generates four pulses. Since the refresh control signal MSELF2 (fifth refresh control signal) is at an L level, the selector 230 outputs the four pulses as control signals CNTR_CLK in succession. Based on the control signals CNTR_CLK and the outputs of the decoder 240, the REF BANK latch circuits 250 to 253 output the refresh activation signals REFACT0 to REFACT3 to the memory banks bank0 to bank3 in succession. In each of the memory banks bank0 to bank3, the row control circuit 35 controls the row decoder 31 and sense amplifiers to refresh memory cells that are connected to a selected word line (first refresh control operation).

Then, the MREF signal generation circuit 200 once resets the refresh control signal MREF to an L level as described above. Since the refresh control signal MSELFD is at an H level, the internal SELF signal generation unit 310 changes the refresh control signal MSELF2 (fifth refresh control signal) to the active level (H level).

When the refresh control signal AREFSELF is subsequently input to output the refresh control signal MREF, the pulse signal generation circuit 210 generates four pulses. Since the refresh control signal MSELF2 is at the H level, the selector 230 outputs the first one of the four pulses as a control signal CNTR_CLK. Based on the control signal CNTR_CLK and the outputs of the decoder 240, one of the REF BANK latch circuits 250 to 253 outputs a refresh activation signal REFACT to its corresponding memory bank. In the one of the memory banks bank0 to bank3, the row control circuit 35 controls the row decoder 31 and sense amplifiers to refresh memory cells that are connected to a selected word line (second refresh control operation).

(Configuration of Refresh Counter 15)

Next, the configuration of the refresh counter 15 shown in FIG. 1 will be described with reference to the drawings.

Figure 5A:
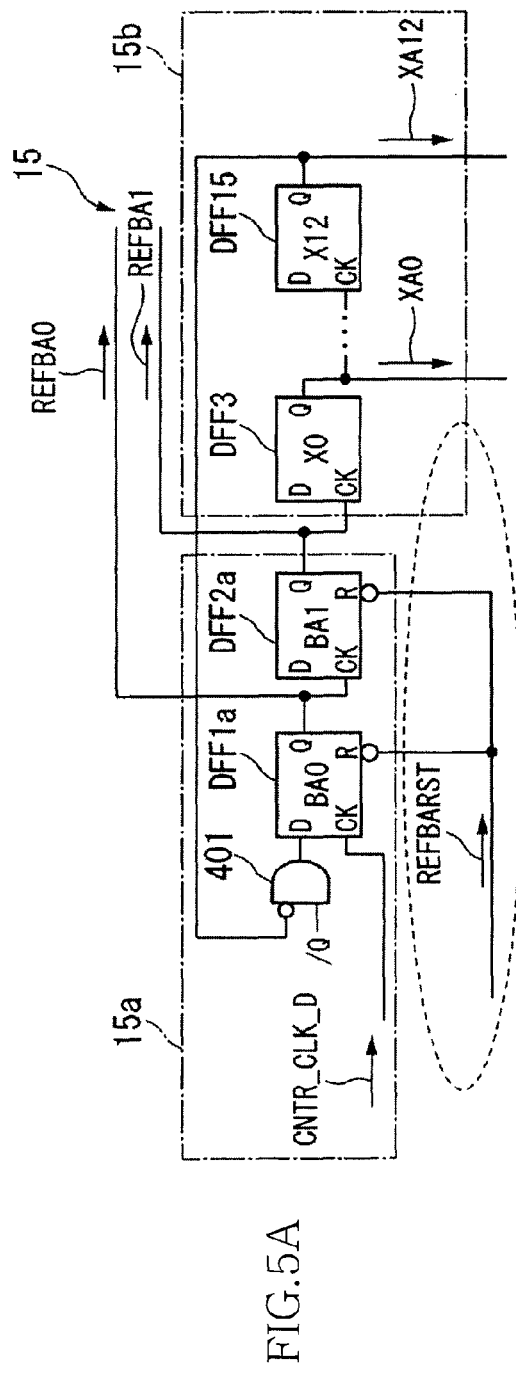
FIG. 5A is a block diagram showing the configuration of the refresh counter 15 shown in FIG. 1.
Figure 5B:
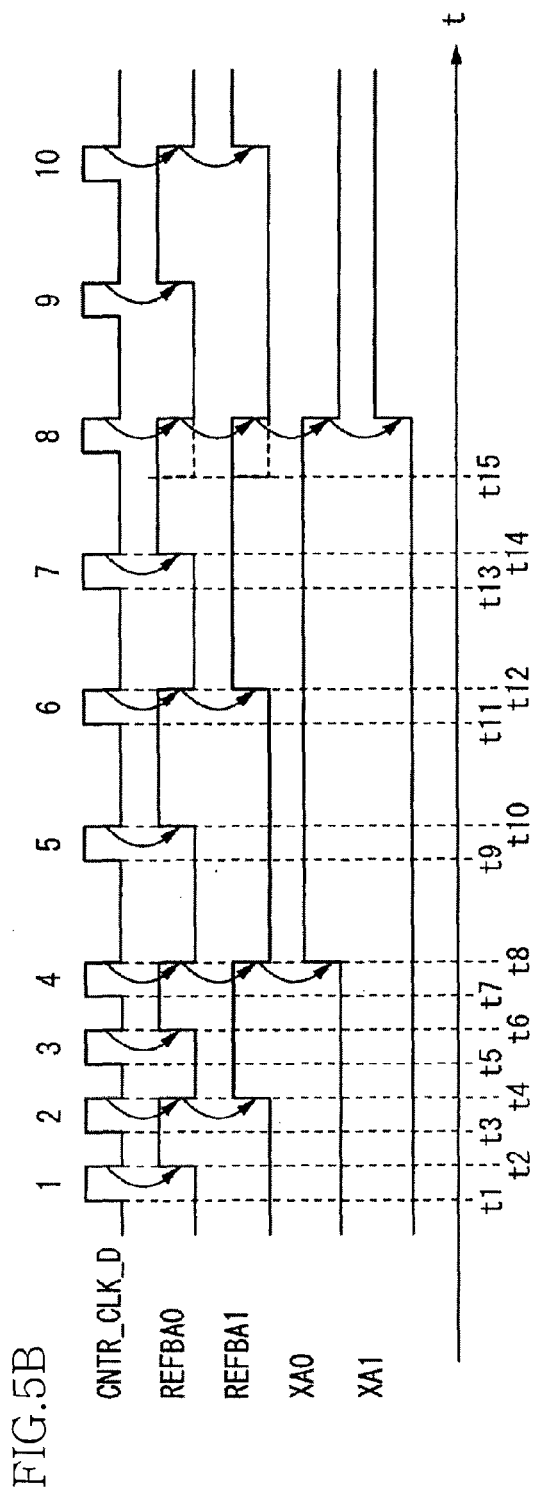
FIG. 5B is a timing chart showing a count operation of the refresh counter 15 shown in FIG. 5A.

FIG. 5A is a block diagram showing the configuration of the refresh counter 15 shown in FIG. 1. FIG. 5B is a timing chart showing a count operation thereof.

As shown in FIG. 5A, the refresh counter 15 includes the refresh counter bank 15a and a refresh counter row 15b.

For example, the refresh counter bank 15a includes two D-type flip-flops DFF1a and DFF2a which correspond to the two bits of the internal bank address REFBA0 and REFBA1.

The refresh counter row 15b includes 13 D-type flip-flops DFF3 to DFF15 which correspond to the 13 bits of the internal row address XA0 to XA12.

The 15 D-type flip-flops each are a known flip-flop of so-called toggle type. A toggle type flip-flop inverts the logic of data to be output from a data output terminal, or Q terminal, in synchronization with a fall of a clock signal that is input to a clock terminal, or CK terminal. In FIG. 5A, the D-type flip-flops are shown with their /Q terminals omitted. A /Q terminal refers to a terminal that outputs data of inverted logic with respect to data output from a Q terminal.

The CK terminals of the D-type flip-flops are connected to the Q terminals of the D-type flip-flops in the respective prior stages. The CK terminal, or clock terminal, of the D-type flip-flop DFF1a in the initial stage is connected to the output of the delay circuit 235 of the REF control circuit 22 shown in FIG. 2, whereby the control signal CNTR_CLK_D is input to the CK terminal.

Although not shown in FIG. 5A, the /Q terminals of the D-type flip-flops are connected to the D terminals of the respective D-type flip-flops themselves. Note that, as shown in FIG. 5A, the D terminal of the D-type flip-flop DFF1a in the initial stage is connected with the output of a logic circuit 401. The logic circuit 401 is a two-input one-output logic circuit. The logic circuit 401 ANDs the inverted logic of the logic that appears on the Q terminal of the D-type flip-flop DFF15 in the final stage (or equivalently, the logic that appears on the /Q terminal thereof) and the logic that appears on the /Q terminal of the D-type flip-flop DFF1a in the initial stage.

The two D-type flip-flops DFF1a and DFF2a of the refresh counter bank 15a have an R terminal. The R terminal is intended to reset data that appears on the Q terminal to an initial value. The R terminals of the D-type flip-flops DFF1a and DFF2a are connected to the output of the one-shot reset signal generation unit 300 of the SELF state generation circuit 23, whereby the counter reset signal REFBARST is input to the R terminals. If the counter reset signal REFBARST of L level is input to the R terminals, the D-type flip-flops DFF1a and DFF2a reset data appearing on the Q terminals to "0" (L level).

With such a circuit configuration, the refresh counter performs a count-up operation when a control signal CNTR_CLK_D is input from the REF control circuit 22. The refresh counter bank 15a of the refresh counter 15 outputs the internal bank address REFBA0 and REFBA1 to the decoder 240 of the REF control circuit 22. The refresh counter row 15b of the refresh counter 15 outputs the internal row address XA0 to XA12 to the row decoders 31 of the memory banks bank0 to bank3 in common through the selector 16 shown in FIG. 1. The row decoders 31 select a word line whose location is specified by the internal row address XA0 to XA12.

FIG. 5B is a timing chart for explaining the count-up operation of the refresh counter 15. FIG. 5B shows changes of the outputs of the refresh counter over time.

Suppose, in FIG. 5B, that all the bits of the internal row address XA0 to XA12 have an initial value of "0" (L level). Suppose also that the a REF command (refresh command) is input to the command decoder 20 of the semiconductor device 10 at a time prior to time t1.

At times t1 to t8, the REF control circuit 22 outputs the control signal CNTR_CLK_D as pulses 1 to 4 shown in FIG. 5B according to the refresh control signal AREF (first refresh control signal).

As a result, the D-type flip-flop DFF1a in the initial stage changes the internal bank address REFBA0 from "0" (L level) to "1" (H level) at time t2, from "1" to "0" at time t4, from "0" to "1" at time t6, and from "1" to "0" at time t8 in synchronization with the falls of the control signal CNTR_CLK_D.

The D-type flip-flop DFF2a in the second stage changes the internal bank address REFBA1 from "0" to "1" at time t4 and from "1" to "0" at time t8 in synchronization with the falls of the internal bank address REFBA0 which is the output of the D-type flip-flop DFF1a in the first stage.

In times t1 to t8, the refresh counter bank 15a inputs the following internal row addresses (REFBA0,REFBA1) to the decoder 240 (see FIG. 2) of the REF control circuit 22: (REFBA0,REFBA1)="00" until time t2; (REFBA0, REFBA1)="10" between times t2 and t4; (REFBA0, REFBA1)="01" between times t4 and t6; and (REFBA0, REFBA1)="11" between times t6 and t8.

Time equivalent to the delay time of the delay circuit 235 will hereinafter be referred to as Δt. The control signal CNTR_CLK is input to the REF BANK latch circuit 250 of the REF control circuit 22 at time (t1−Δt) which is time Δt before time t1. The REF BANK latch circuit 250 changes the refresh activation signal REFACT0 to the active level (H level) in response to the rise of the control signal CNTR_CLK. Consequently, the row control circuit 35 of the memory bank bank0 controls the row decoder 31 to activate a word line having an internal row address XA0 to XA12="00 . . . 00" ("0" in all the 13 bits) in the memory array 34.

Similarly, the control signal CNTR_CLK is input to the REF BANK latch circuit 251 of the REF control circuit 22 at time (t3−Δt). The REF BANK latch circuit 251 changes the refresh activation signal REFACT1 to an H level in response to the rise of the control signal CNTR_CLK. Consequently, the row control circuit 35 of the memory bank bank1 controls the row decoder 31 to activate a word line having the internal row address XA0 to XA12="00 . . . 00" in the memory array 34.

Similarly, the control signal CNTR_CLK is input to the REF BANK latch circuit 252 of the REF control circuit 22 at time (t5−Δt). The REF BANK latch circuit 252 changes the refresh activation signal REFACT2 to an H level in response to the rise of the control signal CNTR_CLK. Consequently, the row control circuit 35 of the memory bank bank2 controls the row decoder 31 to activate a word line having the internal row address XA0 to XA12="00 . . . 00" in the memory array 34.

Similarly, the control signal CNTR_CLK is input to the REF BANK latch circuit 253 of the REF control circuit 22 at time (t7−Δt). The REF BANK latch circuit 253 changes the refresh activation signal REFACT3 to an H level in response to the rise of the control signal CNTR_CLK. Consequently, the row control circuit 35 of the memory bank bank3 controls the row decoder 31 to activate a word line having the internal row address XA0 to XA12="00 . . . 00" in the memory array 34.

In such a manner, refresh operations on memory cells are performed in the four memory banks bank0 to bank3 with time differences, based on the internal bank address REFBA0 and REFBA1 output from the refresh counter bank 15a of the refresh counter 15 and the control signal CNTR_CLK generated by the REF control circuit (first refresh control operation). The time differences are equivalent to the cycles of the control signal CNTR_CLK. The control signal CNTR_CLK has cycles twice as long as the delay time that is set in the delay circuits in the pulse signal generation circuit 21 of the REF control circuit 22. (For example, assuming that the delay circuits of the pulse signal generation circuit 210 have equal delay times, a time difference between the first pulse and the second pulse is the sum of the delay times set in the delay circuit 213 and the delay circuit 214.) The control signal CNTR_CLK has a pulse width equal to the delay time set in the delay circuit 211 of the pulse signal generation circuit 210.

Next, a description will be given of a case where a SELF command (self refresh command) is input to the command decoder 20 of the semiconductor device 10 at a time prior to time t1.

Again, at times t1 to t8, the REF control circuit 22 outputs the control signal CNTR_CLK_D as pulses 1 to 4 shown in FIG. 5B according to the refresh control signal AREF (first refresh control signal). The refresh counter bank 15a inputs the following internal row addresses (REFBA0,REFBA1) to the decoder 240 of the REF control circuit 22: (REFBA0, REFBA1)="00" until time t2; (REFBA0,REFBA1)="10" between times t2 and t4; (REFBA0,REFBA1)="01" between times t4 and t6; and (REFBA0,REFBA1)="11" between times t6 and t8. The REF control circuit 22 thus performs the foregoing first refresh control operation. At time t8, the D-type flip-flop DFF3 of the refresh counter row 15b changes the internal row address XA0 from "0" to "1" in response to the fall of the internal bank address REFBA1. The resulting internal row address XA0 to XA12 is "10 . . . 00."

Subsequently, at time t9 (a time after a lapse of one cycle of the oscillator 25, i.e., after the lapse of a self refresh cycle since time t1), the REF control circuit 22 outputs the control signal CNTR_CLK_D as pulse 5 shown in FIG. 5B according to the refresh control signal AREFSELF (third refresh control signal). More specifically, the pulse signal generation circuit 210 generates four pulses. Since the selector 230 of the REF control circuit 22 shown in FIG. 2 has been switched to the A terminal side, only the first pulse is output as the control signal CNTR_CLK and the control signal CNTR_CLK_D.

The control signal CNTR_CLK is input to the REF BANK latch circuit 250 of the REF control circuit 22 at time (t9−Δt) which is time Δt before time t9. The REF BANK latch circuit 250 changes the refresh activation signal REFACT0 to the active level (H level) in response to the rise of the control signal CNTR_CLK. Consequently, the row control circuit 35 of the memory bank bank0 controls the row decoder 31 to activate a word line having an internal row address XA0 to XA12="10 . . . 00" ("1" in the least significant bit and "0" in all the other 12 bits) in the memory array 34.

At time t10, the D-type flip-flop DFF1a in the initial stage changes the internal bank address REFBA0 from "0" to "1" in response to the fall of the control signal CNTR_CLK_D.

Similarly, at time t11 which is after the lapse of a self refresh cycle since time t9, the REF control circuit 22 outputs the control signal CNTR_CLK_D as pulse 6 shown in FIG. 5B according to the refresh control signal AREFSELF.

Again, the control signal CNTR_CLK is input to the REF BANK latch circuit 251 of the REF control circuit 22 at time (t11−Δt) which is time Δt before time t11. The REF BANK latch circuit 251 changes the refresh activation signal REFACT1 to an H level in response to the rise of the control signal CNTR_CLK. Consequently, the row control circuit 35 of the memory bank bank1 controls the row decoder 31 to activate a word line having the internal row address XA0 to XA12="10 . . . 00" ("1" in the least significant bit and "0" in all the other 12 bits) in the memory array 34.

At time t12, the D-type flip-flop DFF1a in the initial stage changes the internal bank address REFBA0 from "1" to "0" in response to the fall of the control signal CNTR_CLK_D. The D-type flip-flop DFF2a in the second stage changes the internal bank address REFBA1 from "0" to "1" in response to the fall of the internal bank address REFBA0.

Similarly, at time t13 which is after the lapse of a self refresh cycle since time t11, the REF control circuit 22 outputs the control signal CNTR_CLK_D as pulse 7 shown in FIG. 5B according to the refresh control signal AREFSELF.

Again, the control signal CNTR_CLK is input to the REF BANK latch circuit 252 of the REF control circuit 22 at time (t13−Δt) which is time Δt before time t13. The REF BANK latch circuit 252 changes the refresh activation signal REFACT2 to an H level in response to the rise of the control signal CNTR_CLK. Consequently, the row control circuit 35 of the memory bank bank2 controls the row decoder 31 to activate a word line having the internal row address XA0 to XA12="10 . . . 00" ("1" in the least significant bit and "0" in all the other 12 bits) in the memory array 34.

At time t14, the D-type flip-flop DFF1a in the initial stage changes the internal bank address REFBA0 from "0" to "1" in response to the fall of the control signal CNTR_CLK_D.

Subsequently, the refresh counter 15 continues the count-up operation to count up its output, i.e., the internal bank address and the internal row address until a self refresh exit command (SELF Exit command) is input to the command decoder 20. Based on the internal bank address, the REF control circuit 22 outputs a refresh activation signal REFACT to a corresponding memory bank. The row control circuit 35 of the memory bank activates the internal row decoder 31 and sense amplifiers to perform a refresh control operation based on the input refresh activation signal REFACT, thereby refreshing memory cells selected by the word line corresponding to the internal row address.

In such a manner, the four memory banks bank0 to bank3 each perform a refresh operation on memory cells so as not to overlap with the refresh operations of the other memory banks based on internal bank addresses REFBA0 and REFBA1 output from the refresh counter bank 15a of the refresh counter 15 and the control signal CNTR_CLK generated by the REF control circuit (second refresh control operation). The intervals (time differences) of the refresh operations in the memory banks are equal to the cycles of the refresh control signal AREFSELF, i.e., the cycles of the oscillator 25.

In FIG. 5B, when a self refresh exit command (SELF Exit command) is input to the command decode 20 at time t15, the refresh control signal MSELF (second refresh control signal) becomes an L level. The one-shot reset signal generation unit 300 (see FIG. 4A) then changes the counter reset signal REFBARST from an H level to an L level. The D-type flip-flops DFF1a and DFF2a of the refresh counter bank 15a reset the respective bits of the internal bank address REFBA0 and REFBA1 to "0" (L level).

Suppose that a SELF Exit command is input to bring the semiconductor device 10 into a standby state and then the semiconductor device 10 enters a refresh state again (a REF command or a SELF command is input to the command decoder 20). In such a case, the first refresh control operation can select word lines specified by the same internal row address in the four memory banks for refresh.

Without a reset function, when the semiconductor device 10 exits from self refresh at the foregoing time t15, the refresh counter 15 would retain an internal bank address (REFBA0, REFBA1)="11" and an internal row address XA0 to XA12="10 . . . 00" ("1" in the least significant bit and "0" in all the other 12 bits). When, in such a state, a REF command or a SELF command is input next, the REF control circuit 22 outputs four pulses of the control signal CNTR_CLK. The REF control circuit 22 changes the refresh activation signal REFACT3 to an H level to activate the memory bank bank3 according to the first control signal CNTR_CLK. In the memory bank bank3, a word line specified by the internal row address XA0 to XA12="10 . . . 00" is selected, and memory cells connected to the word line are refreshed. The REF control circuit 22 subsequently activates the memory banks bank0 to bank2 according to the second to fourth control signals CNTR_CLK. In each of the memory banks bank0 to bank2, a word line specified by an internal row address XA0 to XA12="01 . . . 00" is selected, and memory cells connected to the word line are refreshed.

The semiconductor device 10 according to the present embodiment has the reset function. When the semiconductor device 10 exits from self refresh at time t15 and a REF command or SELF command is input next, the memory banks bank0 to bank3 are activated in order according to the first to fourth control signals CNTR_CLK. In each of the memory banks bank0 to bank3, a word line specified by the internal row address XA0 to XA12="10 . . . 00" is selected, and memory cells connected to the word line are refreshed.

As described above, the semiconductor device 10 according to the present embodiment has the reset function of resetting the refresh counter bank 15a to an initial value. Memory cells connected to word lines having the same internal row address in the four memory banks can thus always be refreshed by a bank operation which selects such word lines.

(Auto Refresh Operation)

The circuits in the semiconductor device 10 of the present embodiment are configured as described above. To describe the characteristics and effects of such circuits, an auto refresh operation will initially be described where a REF command (refresh command) is input to the semiconductor device 10.

Figure 6:
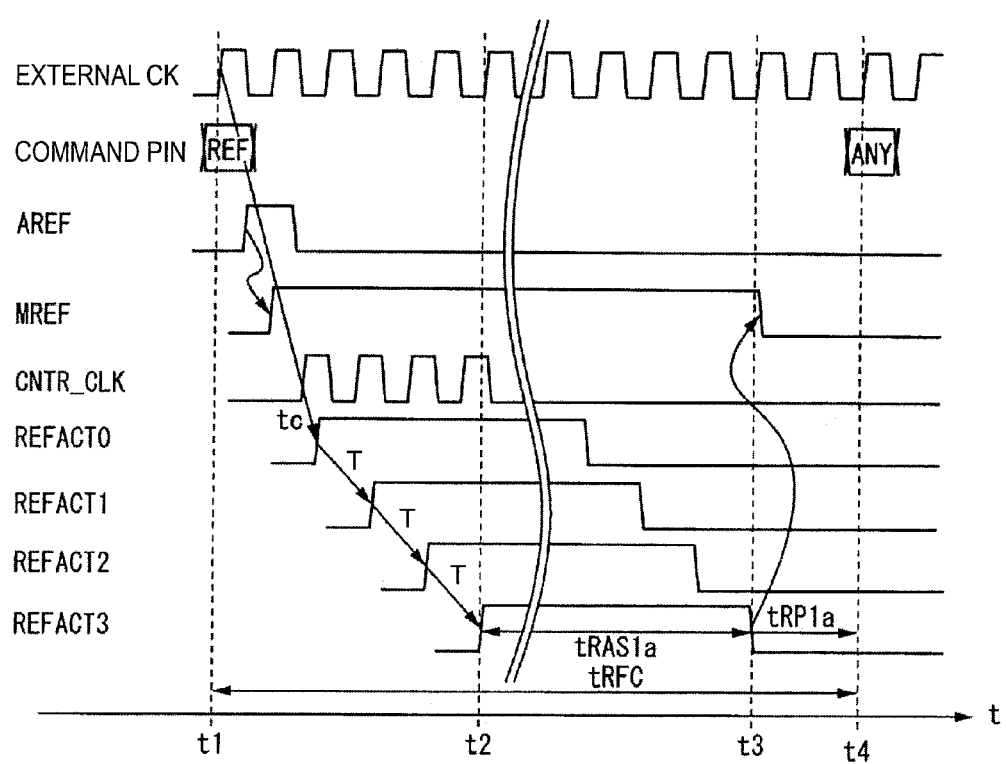
FIG. 6 is a timing chart of an auto refresh operation (when a REF command is supplied) of the semiconductor device 10.

FIG. 6 is a timing chart showing changes of essential signals over time in an auto refresh operation which the semiconductor device 10 performs when a REF command is received.

At time t1, a REF command is input to the command pads 20p (command pins). The command decoder 20 decodes the REF command and outputs the refresh control signal AREF (first refresh control signal) to the REF control circuit 22. The MREF signal generation circuit 200 of the REF control circuit 22 changes the refresh control signal MREF (fourth refresh control signal) to the active level (H level). The pulse signal generation circuit 210 of the REF control circuit 22 generates four pulses having a pulse width equivalent to the delay time set in the internal delay circuits, at cycles (shown as time T in FIG. 6) twice as long as the delay time. Since the refresh control signal MSELF2 (fifth refresh control signal) is at an L level here, the selector 230 generates four control signals CNTR_CLK as shown in FIG. 6. The generation intervals (time differences) of the control signals CNTR_CLK are also time T. As mentioned above, the refresh counter bank 15a outputs "00," "10," "01," and "11" in order as the internal bank address (REFBA0,REFBA1) at the rises of the four control signals CNTR_CLK, respectively.

Consequently, as shown in FIG. 6, the REF BANK latch circuits 250 to 253 generate the refresh activation signals REFACT0 to REFACT3 of the active level (H level) at intervals of time T after a lapse of command accepting time tc. The command accepting time tc refers to the time between time t1 when the REF command is input and a time when the refresh activation signal REFACT0 is activated. The refresh activation signals REFACT0 to REFACT3 of H level are input to the memory banks bank0 to bank3, respectively. In each memory bank, the row control circuit 35 controls the row decoder 31, sense amplifiers and the like to refresh memory cells connected to a word line whose location in the memory array 34 is specified by the internal row address XA0 to XA12 output from the refresh counter row 15b (first refresh control operation).

In FIG. 6, time t2 refers to a time when the refresh activation signal REFACT3 is input to the memory bank bank3 which is the fourth to start an auto refresh operation. The auto refresh operation in the memory bank bank3 ends after a lapse of time where the memory bank is active (referred to as row address active time tRAS1a) since time t2. The row control circuit 35 of the memory bank bank3 then outputs the refresh end signal REFEND3 to the REF BANK latch circuit 253. The REF BANK latch circuit 253 changes the refresh activation signal REFACT3 to the inactive level (L level) (time t3).

Since the refresh activation signals REFACT0 to REFACT2 are also at an L level here, the NOR circuit 280 of the REF control circuit 22 changes the output signal REFACTORB to an H level. The MREF signal generation unit 200 then resets the refresh control signal MREF to an L level. Subsequently, the row control circuit 35 of the memory bank bank3 which has been performing the last auto refresh operation performs precharge control. The precharge control includes deactivating the row decoder 31 (resetting the word line to an L level), deactivating sense amplifiers (resetting a sense amplifier activation signal to an initial level), and precharging bit lines to an initial level. At time t4 after a lapse of precharging time of the memory bank (referred to as row address precharge time tRP1a) since time t3, it becomes possible to input an arbitrary command (ANY command) to the semiconductor device 10.

The semiconductor device 10 performs an auto refresh operation as described above. As shown in FIG. 6, time tRFC between when the semiconductor device 10 accepts a REF command and when it becomes possible to accept a next command is given by tRFC=tc+T×3+tRAS1a+tRP1a.

(Self Refresh Operation)

Next, a self refresh operation will be described where a SELF command (self refresh command) is input to the semiconductor device 10.

Figure 7:
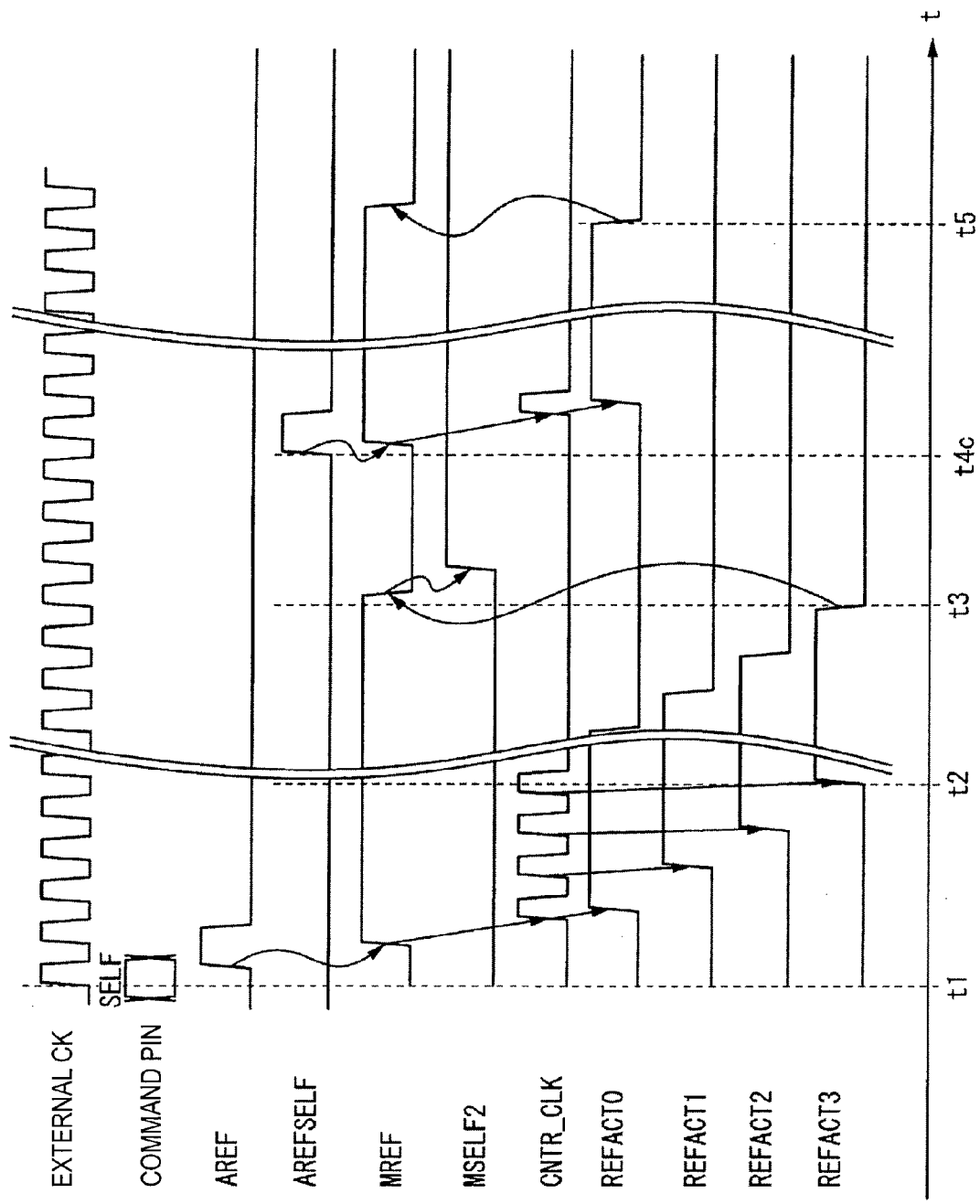
FIG. 7 is a timing chart of a self refresh operation (when a SELF command is supplied) of the semiconductor device 10.

FIG. 7 is a timing chart showing changes of essential signals over time in a self refresh operation which the semiconductor device 10 performs when a SELF command is received.

At time t1, a SELF command is input to the command pads 20p (command pins). The command decoder 20 decodes the SELF command and outputs the refresh control signal AREF (first refresh control signal) to the REF control circuit 22 like when a REF command is input.

Decoding the SELF command, the command decoder 20 also outputs the refresh control signal MSELF (second refresh control signal) to the oscillator 25 and the SELF state generation circuit 23.

When the refresh control signal MSELF is input, the oscillator 25 produces self-excited oscillations. After a lapse of predetermined time or oscillation cycle (time t4c), the oscillator 25 changes the refresh control signal AREFSELF (third refresh control signal) to the active level (H level).

The refresh control signal MREF (fourth refresh control signal) of the active level (H level) is input to the latch circuit 312 inside the SELF state generation circuit 23 before the refresh control signal MSELFD is. The refresh control signal MSELFD is the delayed refresh control signal MSELF (second refresh control signal) of the active level (H level). The SELF state generation circuit 23 thus maintains the refresh control signal MSELF2 (fifth refresh control signal) at an L level (see "combination 3" in FIG. 4C). Consequently, like when a REF command is input to the semiconductor device 10, the selector 230 of the REF control circuit 22 generates four control signals CNTR_CLK as shown in FIG. 7.

Subsequently, the memory banks bank0 to bank3 perform refresh operations as with the foregoing auto refresh operation. The auto refresh operation in the memory bank bank3 ends at time t3. The MREF signal generation unit 200 then resets the refresh control signal MREF to an L level.

Here, the refresh control signal MREF (fourth refresh control signal) input to the latch circuit 312 in the SELF state generation circuit 23 becomes the inactive level (L level). Since the refresh control signal MSELFD, i.e., the delayed refresh control signal MSELF (second refresh control signal) is at the active level (H level), the SELF state generation circuit 23 changes the refresh control signal MSELF2 (fifth refresh control signal) to the active level (H level) (see "combination 4" in FIG. 4C). Consequently, the selector 230 of the REF control circuit 22 switches its input terminal from the B terminal, to which four pulses are input from the pulse signal generation circuit 210, to the A terminal, to which a single pulse is input.

When the oscillator 25 changes the refresh control signal AREFSELF (third refresh control signal) to the active level (H level), at time t4c, the MREF signal generation circuit 200 of the REF control circuit 22 changes the refresh control signal MREF (fourth refresh control signal) to the active level (H level) again. Like when a REF command is input to the semiconductor device 10, the pulse signal generation circuit 210 of the REF control circuit 22 generates four pulses having a pulse width equivalent to the delay time set in the internal delay circuits, at cycles (time T shown in FIG. 6) twice as long as the delay time. Since the refresh control signal MSELF2 (fifth refresh control signal) is at an H level here, the selector 230 generates one control signal CNTR_CLK as shown in FIG. 7. The refresh counter bank 15a outputs "00" as the internal bank address (REFBA0,REFBA1) at the rise of the one control signal CNTR_CLK as described above.

Consequently, the REF BANK latch circuit 250 generates the refresh activation signal REFACT0 of the active level (H level). The refresh activation signal REFACT0 of H level is input to the memory bank bank0. In the memory bank bank0, the row control circuit 35 controls the row decoder 31, sense amplifiers and the like to refresh memory cells connected to a word line whose location in the memory array 34 is specified by the internal row address XA0 to XA12 output from the refresh counter row 15b (second refresh control operation).

After a lapse of time where the memory bank bank0 is active, the self refresh operation in the memory bank bank0 ends. The row control circuit 35 of the memory bank bank0 then outputs the refresh end signal REFEND0 to the REF BANK latch circuit 250. The REF BANK latch circuit 250 changes the refresh activation signal REFACT0 to the inactive level (L level) (time t5).

Since the refresh activation signals REFACT1 to REFACT3 are also at an L level here, the NOR circuit 280 of the REF control circuit 22 changes the output signal REFACTORB to an H level. The MREF signal generation unit 200 then resets the refresh control signal MREF to an L level. Subsequently, the row control circuit 35 of the memory bank bank0 which has been performing the self refresh operation performs precharge control. The precharge control includes deactivating the row decoder 31 (resetting the word line to an L level), deactivating sense amplifiers (resetting a sense amplifier activation signal to an initial level), and precharging bit lines to an initial level.

Subsequently, the oscillator 25 sets the refresh control signal AREFSELF (third refresh control signal) to the active level (H level) at the cycles of self-excited oscillations (self refresh cycles) until a self refresh exit command (SELF Exit command) is input. A control signal CNTR_CLK occurs each time the refresh control signal AREFSELF (third refresh control signal) becomes an H level. Consequently, self refresh of memory cells in a memory bank is repeated in order of memory banks 1, 2, 3, 0, 1, 2, 3, . . . .

Figure 8:
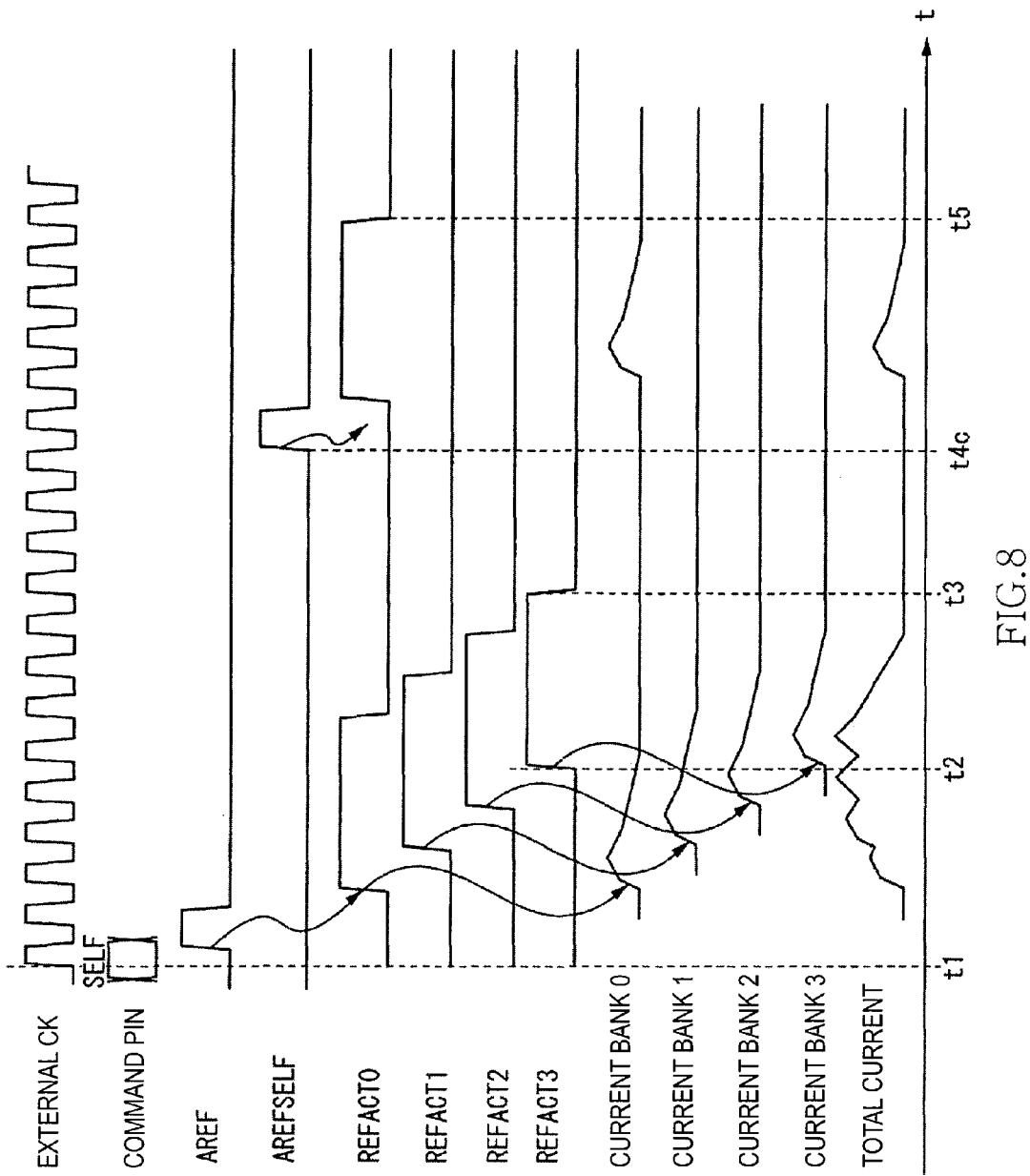
FIG. 8 is a timing chart showing operating current waveforms of the semiconductor device 10 when the SELF command is received.

FIG. 8 is a timing chart showing operating current waveforms of the respective memory banks bank0 to bank3 and an operating current waveform (total current) of the entire memory banks of the semiconductor device 10. In FIG. 8, changes of time are indicated by times t1 to t5 which correspond to times t1 to t5 of FIG. 7, respectively.

When a SELF command is input, the semiconductor device 10 initially performs an auto refresh operation before entering a self refresh operation. Since a self refresh operation refreshes a single memory bank (here, the memory bank bank0), the total current in a self refresh operation shows a peak current (current increase between times t4c and t5) smaller than that of the total current in an auto refresh operation (current increase between times t1 and t3).

Figure 9:
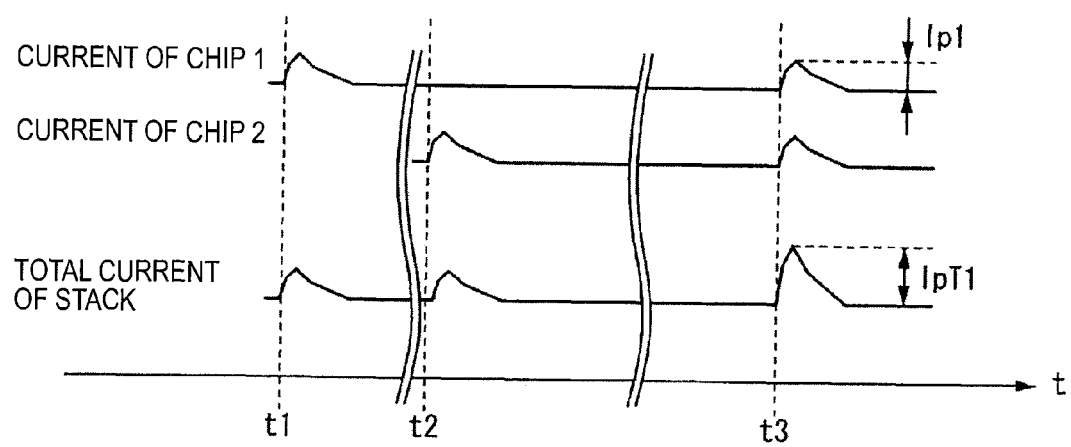
FIG. 9 is current waveforms of a semiconductor device that includes a stack of a plurality of semiconductor devices 10.

FIG. 9 shows current waveforms of a semiconductor device that includes a stack of a plurality of semiconductor devices 10, or chips. The plurality of stacked chips are encapsulated in an MCP or other package. The current waveforms are those of a self refresh operation where SELF commands are input chip by chip. In FIG. 9, the current of a chip 1 and the current of a chip 2 each correspond to the current waveform of the total current in a self refresh operation of FIG. 8. The SELF command supplied to the chip 2 can be delayed with respect to the chip 1 to distribute the times of occurrence of entry peak currents in the entire stack (peak currents in auto refresh operations; such waveforms are omitted in FIG. 9). The times of occurrence of peak currents in self refresh operations can also be staggered like shown at times t1 and t2, respectively. When the self refresh cycles can be set chip by chip and the chips 1 and 2 actually have different self refresh cycles, the self refresh operations of the chips 1 and 2 may overlap and the total current of the stack may have a peak value IpT1 twice the peak value Ip1 of each chip. As will be described later, the peak value IpT1 of the total current of the stack can be reduced since each chip performs self refresh on a single memory bank inside and the peak value Ip1 itself is suppressed low.

An auto refresh operation and a self refresh operation of the semiconductor device 10 have been described so far. Now, effects of the semiconductor device 10 will be described. For that purpose, a semiconductor device 99 without characteristic parts of the semiconductor device 10, namely, the selector 230 of the REF control circuit 22 and the SELF state generation circuit 23 will be described with reference to FIGS. 10 to 12.

Figure 10:
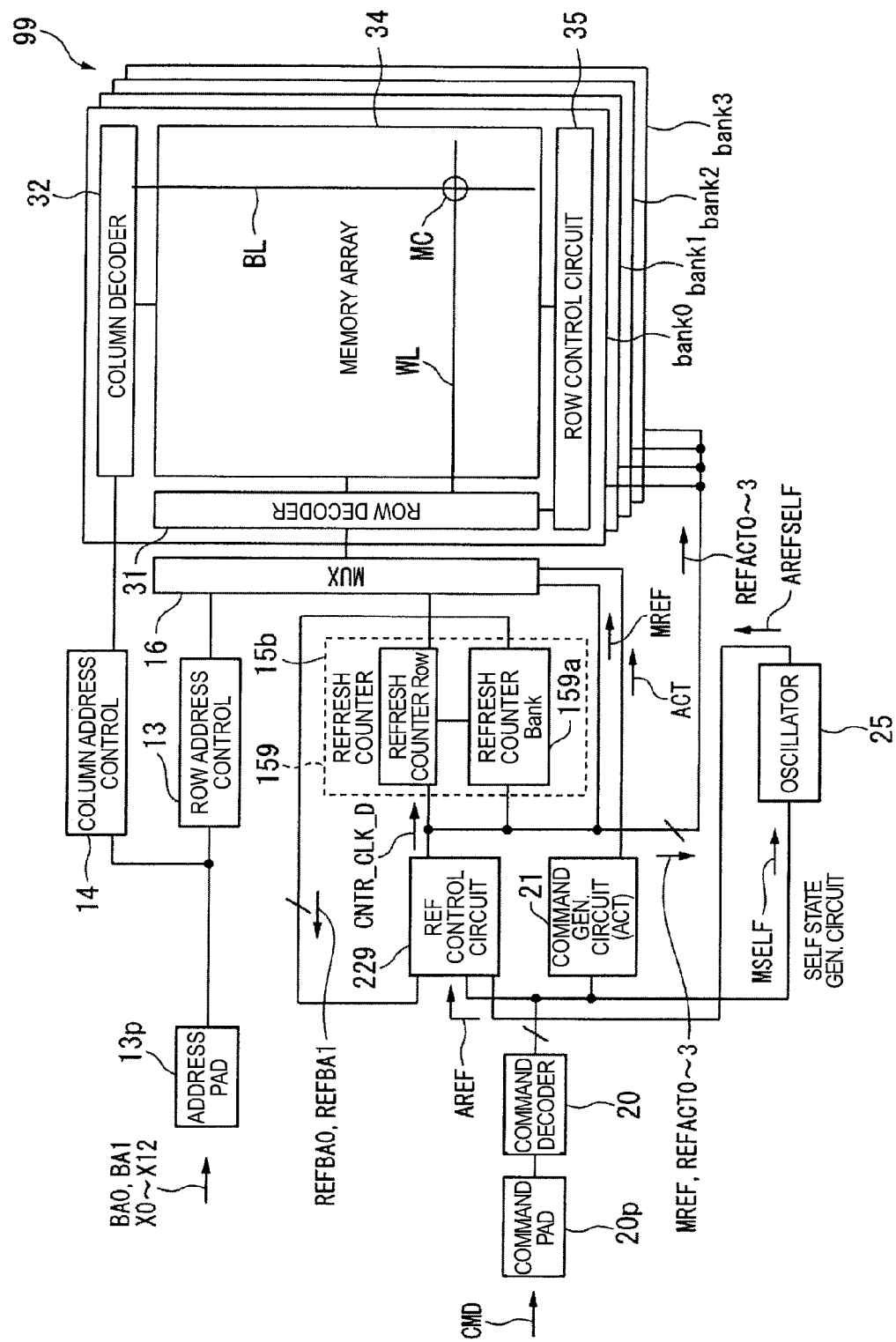
FIG. 10 is a block diagram of a semiconductor device 99.
Figure 11:
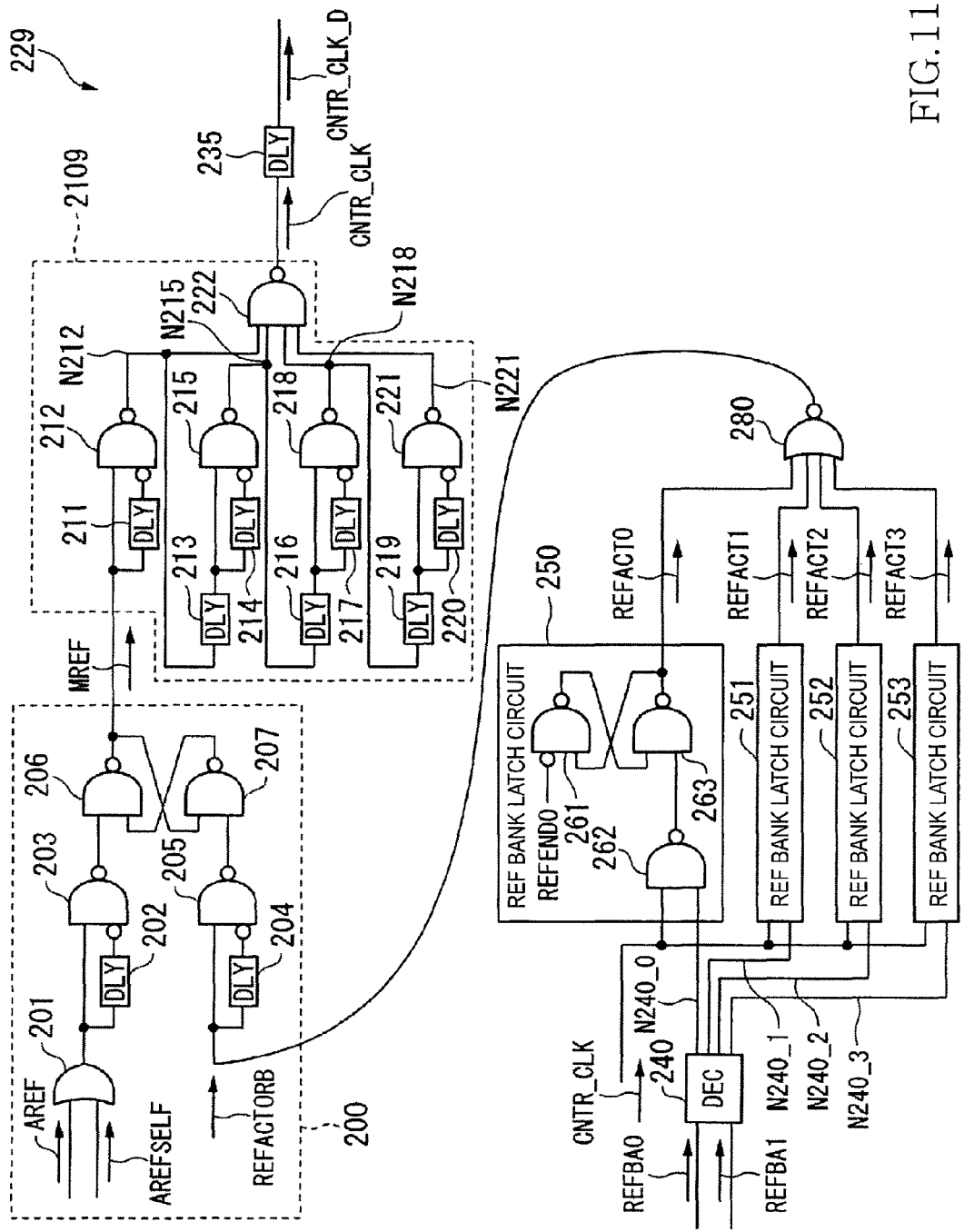
FIG. 11 is a circuit diagram of the REF control circuit 229 shown in FIG. 10.
Figure 12:
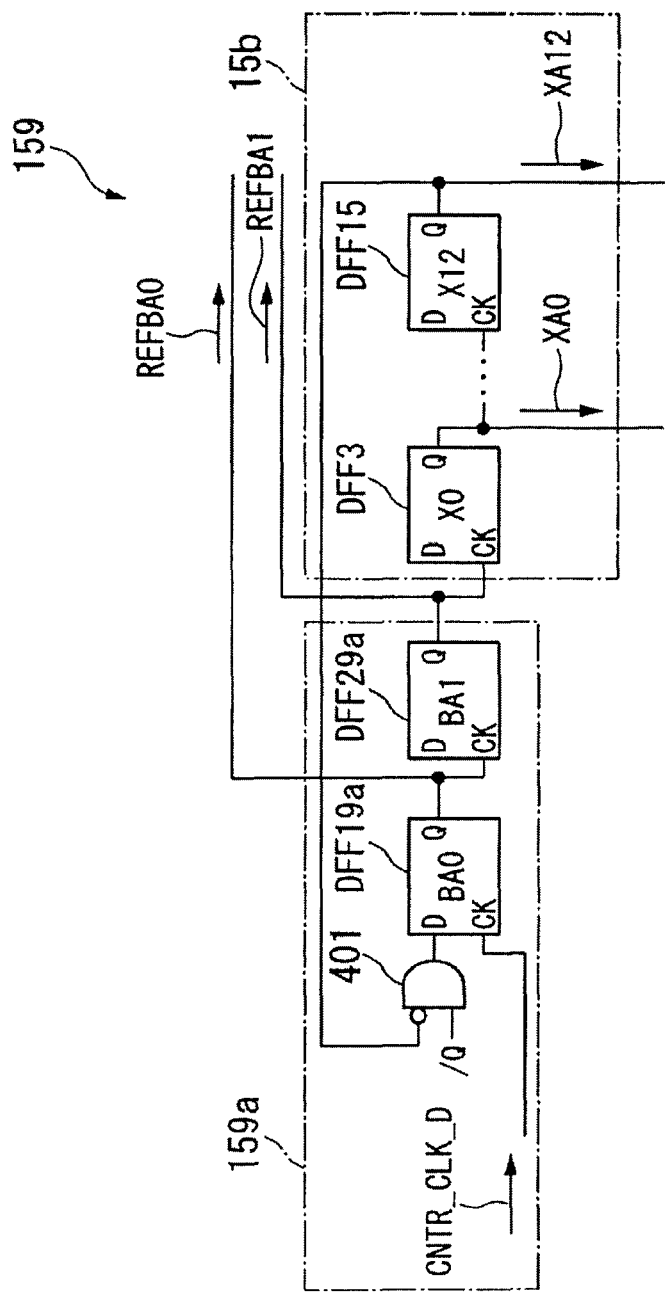
FIG. 12 is a circuit diagram of the refresh counter 159 shown in FIG. 10.

FIG. 10 is a block diagram showing the configuration of the semiconductor device 99. FIG. 11 is a circuit diagram of an REF control circuit 229. FIG. 12 is a block diagram showing the configuration of a refresh counter 159.

The same parts of the semiconductor device 99 shown in FIG. 10 as those of the semiconductor device 10 shown in FIG. 1 are designated by like reference symbols. Description of the same parts will be omitted. The semiconductor device 99 differs from the semiconductor device 10 in the following points.

The semiconductor device 99 includes the REF control circuit 229 and the refresh counter 159 which correspond to the REF control circuit 22 and the refresh counter 15 of the semiconductor device 10, respectively. Unlike the semiconductor device 10, the semiconductor device 99 does not include the SELF state generation circuit 23.

The same parts of the REF control circuit 229 shown in FIG. 11 as those of the REF control circuit 22 of the semiconductor device 10 shown in FIG. 2 are designated by like reference symbols. Description of the same parts will be omitted. The REF control circuit 229 differs from the REF control circuit 22 in the following points.

The REF control circuit 229 includes a pulse signal generation circuit 2109 which corresponds to the pulse signal generation circuit 210 of the REF control circuit 22. Unlike the REF control circuit 22, the REF control circuit 229 does not include the selector 230.

The REF control circuit 229 outputs four control signals CNTR_CLK both when the refresh control signal AREF is input and when the refresh control signal AREFSELF is input. More specifically, when a SELF command is input to the semiconductor device 99, the memory banks bank0 to bank3 perform periodic self refresh operations according to the cycles of the oscillator 25, thereby performing refresh operations with time differences in succession as in the first auto refresh operation.

The same parts of the refresh counter 159 shown in FIG. 12 as those of the refresh counter 15 of the semiconductor device 10 shown in FIG. 4 are designated by like reference symbols. Description of the same parts will be omitted. The refresh counter 159 differs from the refresh counter 15 in the following points.

The refresh counter 159 includes a refresh counter bank 159a which corresponds to the refresh counter bank 15a of the refresh counter 15. The refresh counter bank 159a includes D-type flip-flops DFF19a and DFF29a which output the internal bank address REFBA0 and REFBA1, respectively. Unlike the refresh counter 15, the D-type flip-flops DFF19a and DFF29a are not configured so that the refresh end signal REFBARST is input to their R terminal. The reason is that a self refresh operation includes generating four control signals CNTR_CLK and inputting four control signals CNTR_CLK_D. At the end of a self refresh operation, the internal bank address (REFBA0, REFBA1) is thus always reset to "00." In contrast, when the refresh counter bank 15a of the semiconductor device 10 ends a self refresh operation, the internal bank address (REFBA0,REFBA1) is not always reset to "00" as mentioned above. The refresh counter bank 15a is thus configured so that the refresh end signal REFBARST is input to the R terminals (see FIG. 5A), whereby the internal bank address (REFBA0,REFBA1) is reset to "00."

(Auto Refresh Operation and Self Refresh Operation of Semiconductor Device 99)

The semiconductor device 99 has a different configuration from that of the foregoing semiconductor device 10. A self refresh operation will be described where a SELF command (self refresh command) is input to such a semiconductor device 99. Note that the semiconductor device 99 performs an auto refresh operation by using the same components as those of the semiconductor device 10. Since such an auto refresh operation is the same as that of the semiconductor device 10 described in conjunction with FIG. 6, description thereof will be omitted. A self refresh operation of the semiconductor device 99 will be described with reference to FIG. 13.

Figure 13:
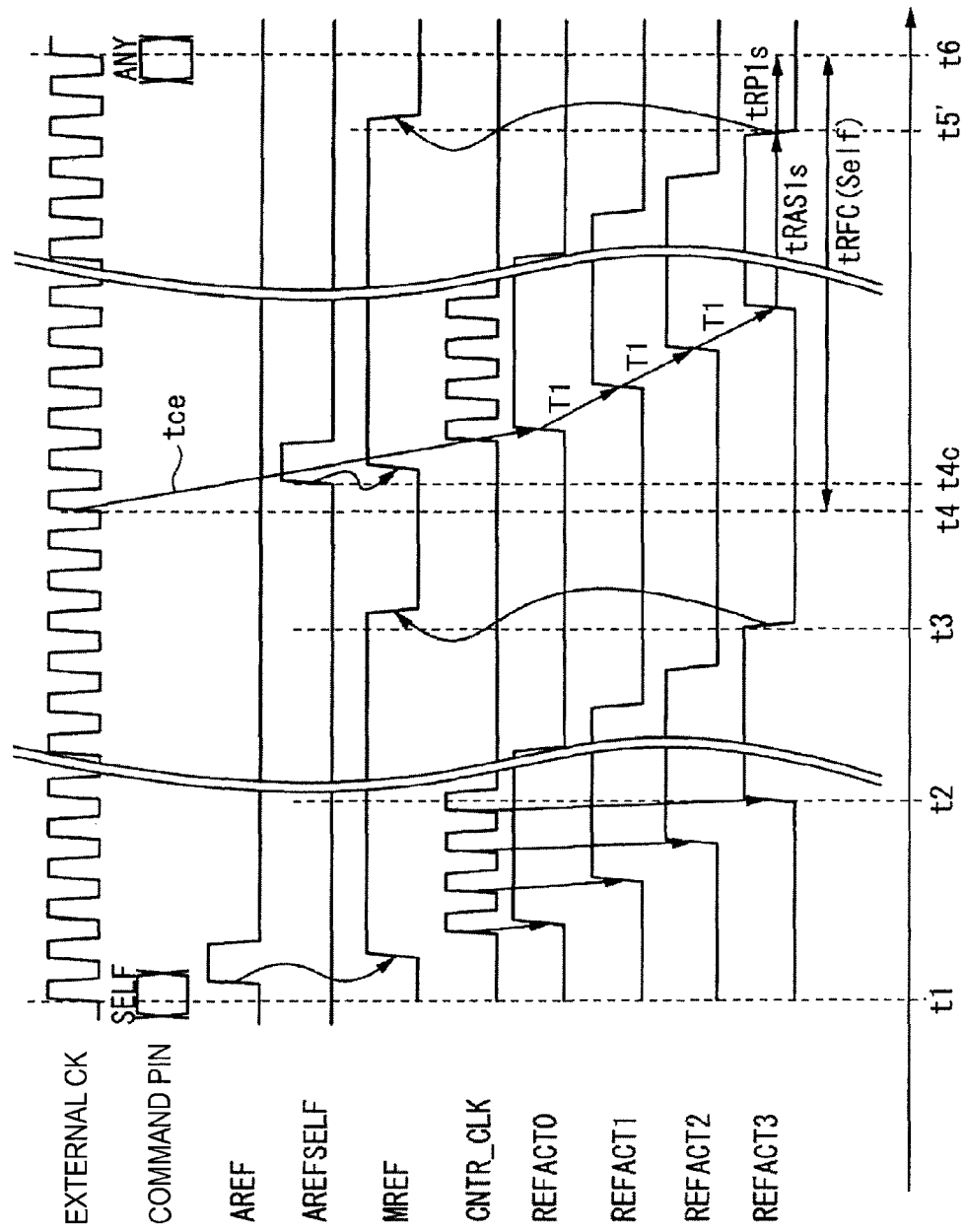
FIG. 13 is a timing chart of operation of the semiconductor device 99 when a SELF command is received.

FIG. 13 is a timing chart showing changes of essential signals over time in a self refresh operation which the semiconductor device 99 performs when a SELF command is received.

In FIG. 13, the operation is the same as an auto refresh operation up to time t4c. Since such an operation is the same as the auto refresh operation of the semiconductor device 10 described in conjunction with FIG. 6, description thereof will be omitted.

In FIG. 13, time t4 indicates time t4 of FIG. 6. More specifically, time t4 indicates a time when an arbitrary command (ANY command) can be accepted in FIG. 6 which shows a timing chart of an auto refresh operation. Even when a SELF command is input to the semiconductor device 99, the first refresh operation to be performed is the same as an auto refresh operation which is performed when a REF command is input. It is therefore possible in principle to input a self refresh exit command (SELF Exit command) to the semiconductor device 99 at time t4 so that the semiconductor device 99 exits into a standby state. In fact, when a SELF command is input to the semiconductor device 99, the timing to start a self refresh operation after auto refresh is determined by the refresh control signal AREFSELF output from the oscillator 25 as has been described with the semiconductor device 10. The timing to start a self refresh operation may thus overlap with the timing to exit from self refresh by means of the input of a SELF Exit command (timing when the refresh control signal AREFSELF is deactivated by the input of a SELF Exit command). The exit time tRFC (Self) from self refresh is determined in consideration of the overlapping timing. More specifically, once a self refresh command is input to the semiconductor device 99, an arbitrary command (ANY command) cannot be input by time t6, the exit time tREF(Self) past time t4.

In the example of FIG. 6, the exit time tREF(Self) is given by tRFC (Self)=tce+T×3+tRAS1$s$+tRP1$s$. Here, tce refers to "time in which the refresh activation signal REFACT0 can be deactivated by the input of a SELF Exit command." Time tce is approximately equal to time tc in which the refresh activation signal REFACT0 is activated by the input of a REF command or SELF command.

Time T is equal to the intervals T of control signals CNTR_CLK in an auto refresh operation. Time T is twice the delay time that is set in the delay circuits of the pulse signal generation circuit 2109. Time tRAS1$s$ refers to time that each of the memory banks bank0 to bank3 needs for refresh in a self refresh operation (self refresh row address active time). Time tRAS1$s$ is approximately equal to tRAS1$a$ in an auto refresh operation. Time tRP1$s$ refers to time that is needed for the memory bank bank3 to complete refresh in a self refresh operation and return to a standby state (self refresh row address precharge time). Time tRP1$s$ is approximately equal to tRP1$a$ in an auto refresh operation.

Figure 14:
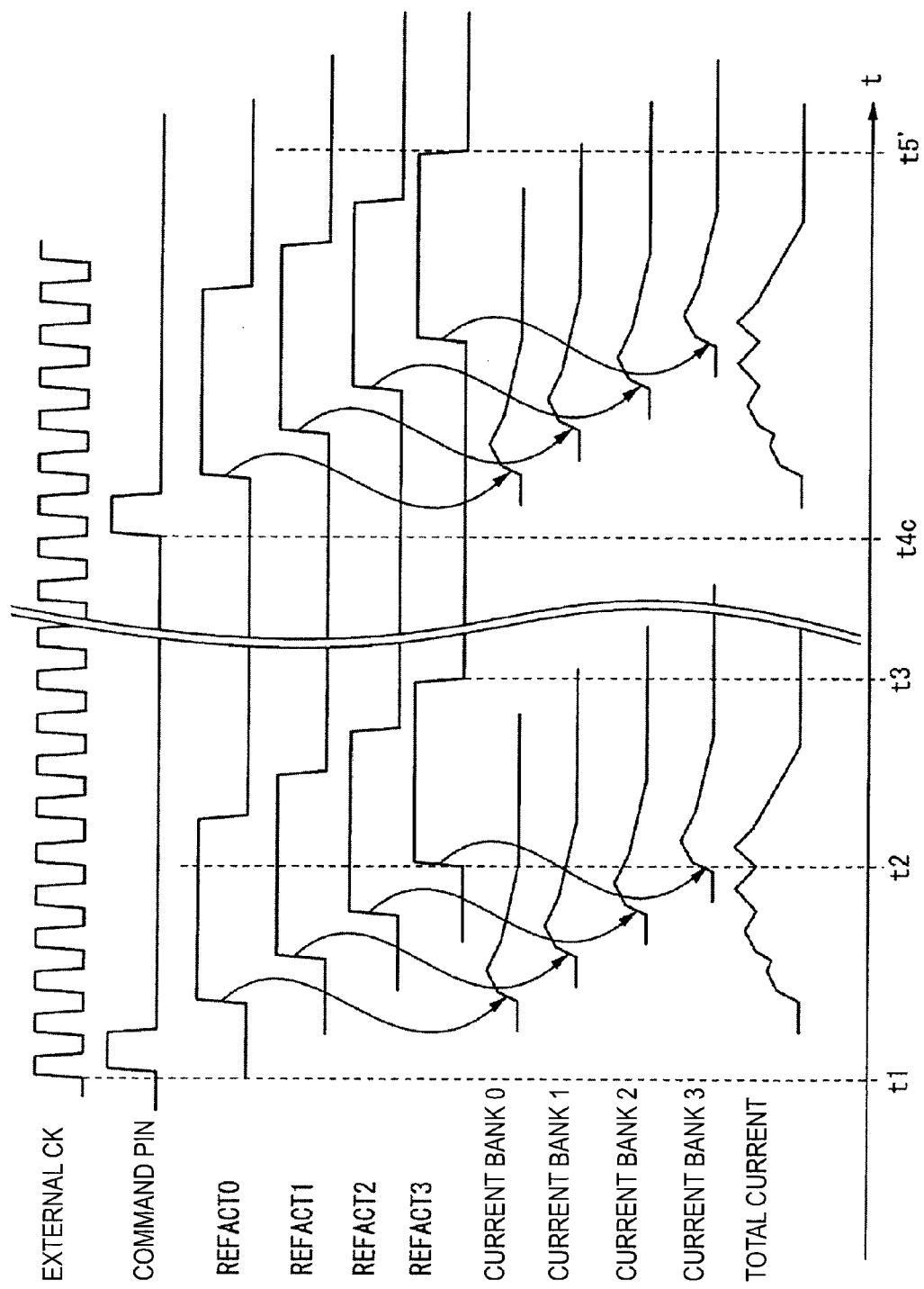
FIG. 14 is a timing chart of current waveform of the semiconductor device 99 when a SELF command is received.

FIG. 14 is a timing chart showing operating current waveforms of the respective memory banks bank0 to bank3 and an operating current waveform (total current) of the entire memory banks of the semiconductor device 99. In FIG. 14, changes of time are indicated by times t1 to t5' which correspond to times t1 to t5' of FIG. 13, respectively.

When a SELF command is input, the semiconductor device 99 initially performs an auto refresh operation and then enters a self refresh operation. Since a self refresh operation refreshes all the memory banks, the total current in a self refresh operation shows the same peak current (current increase between time t4c and t5') as that of the total current in an auto refresh operation (current increase between time t1 and t3).

Figure 15:
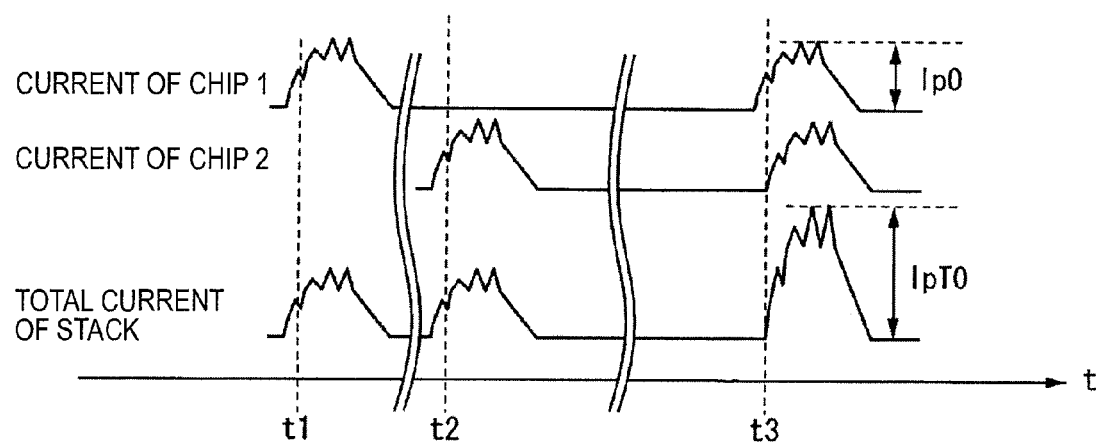
FIG. 15 is current waveforms of a semiconductor device that includes a stack of a plurality of semiconductor devices 99.

FIG. 15 shows current waveforms of a semiconductor device that includes a stack of a plurality of semiconductor devices 99, or chips. The plurality of stacked chips are encapsulated in an MCP or other package. The current waveforms are those of a self refresh operation where SELF commands are input chip by chip. In FIG. 15, the current of a chip 1 and the current of a chip 2 each correspond to the current waveform of the total current in a self refresh operation of FIG. 14. The SELF command supplied to the chip 2 can be delayed with respect to the chip 1 to distribute the times of occurrence of entry peak currents in the entire stack (peak currents in auto refresh operations; such waveforms are omitted in FIG. 14). The times of occurrence of peak currents in self refresh operations can also be staggered like shown at times t1 and t2, respectively. When the self refresh cycles can be set chip by chip and the chips 1 and 2 actually have different self refresh cycles, the self refresh operations of the chips 1 and 2 may overlap and the total current of the stack may have a peak value IpT0 twice the peak value Ip0 of each chip.

(Comparison of Semiconductor Device 10 and Semiconductor Device 99)

As mentioned previously, the exit time tREF(Self) of the semiconductor device 99 is given by tRFC(Self)=tce+T×3+tRAS1s+tRP1s.

On the other hand, when a SELF command is input to the semiconductor device 10, as shown in FIG. 7, the semiconductor device 10 performs an auto refresh operation on all the memory banks bank0 to bank3, enters a self refresh operation, and then generates a control signal CNTR_CLK in each cycle of the oscillator 25 to refresh the memory banks one by one. Such a configuration eliminates the need for "T×3" in the foregoing equation of the exit time tRFC. In other words, the semiconductor device 10 can make the exit time tRFC from self refresh shorter and allow earlier input of an arbitrary command after self refresh as compared to the semiconductor device 99.

In the semiconductor device 99, as shown in FIG. 14, the peak current during a self refresh operation is the same as during an auto refresh operation.

On the other hand, the semiconductor device 10 activates fewer memory banks in a self refresh operation than in an auto refresh operation. As shown in FIG. 8, the peak current during a self refresh operation can thus be made smaller than during an auto refresh operation.

Suppose that a plurality of semiconductor devices 99, or chips, are used to constitute a stacked chip. The peak current value of each chip in a self refresh operation is Ip0 as shown in FIG. 15. For example, in case two chips are stacked, the total current of the stack has a peak current value of IpT0 which is twice Ip0.

Suppose now that a plurality of semiconductor devices 10, or chips, are used to constitute a stacked chip. The peak current value of each chip in a self refresh operation is Ip1 as shown in FIG. 9. For example, in case two chips are stacked, the total current of the stack has a peak current value of IpT1 which is twice Ip1. There holds Ip0>Ip1 since the semiconductor device 10 activates fewer memory banks in a self refresh operation than in an auto refresh operation. The peak current value of the entire stack constituted by the semiconductor devices 10 can thus be made smaller than that of the entire stack constituted by the semiconductor devices 99.

As described above, the semiconductor device 10 includes:
at least two or more memory banks (bank0 to bank3) that each refresh internal memory cells when a refresh activation signal (refresh activation signals REFACT0 to REFACT3) is input; and
a refresh control circuit (REF control circuit 22) that performs a first refresh control operation by outputting the refresh activation signals (refresh activation signals REFACT0 to REFACT3) activating a refresh operation in all of the memory banks to all the respective memory banks when an auto refresh command (REF command) is input, and performs a second refresh control operation by outputting the refresh activation signal (s) activating a refresh operation in a part of the memory banks (one of the refresh activation signals REFACT0 to REFACT3) to the part of the memory banks when a self refresh command (SELF command) is input.

Consequently, according to the present invention, auto refresh based on a refresh command from a memory controller is performed for as many as the number of memory banks (in the present embodiment, four memory banks). On the other hand, self refresh inside the memory is only performed for not as many memory banks as in auto refresh (in the present embodiment, one memory bank) after entry to a self refresh mode based on a self refresh command from the memory controller, for example. This can reduce peak currents during self refresh of the semiconductor device, and can reduce exit time (tRFC) from self refresh.

The technical concept of the present invention may be applied to various semiconductor devices in addition to various memory devices. Further, the configuration of circuits in various circuit block in FIGs or other circuit generating various control signals is not limited to the configuration depicted in the embodiment.

The technical concept of the present invention may be applied to various semiconductor devices. For example, the present invention may be applied to semiconductor products in general, including functions as CPUs (Central Processing Units), MCUs (Micro Control Units), DSPs (Digital Signal Processors), ASICs (Application Specific Integrated Circuits), ASSPs (Application Specific Standard Products), and memories. Examples of the product types of the semiconductor devices to which the present invention is applicable include an SOC (System On Chip), MCP (Multi Chip Package), and POP (Package On Package). The present invention may be applied to semiconductor devices that have any of such product types and package types. When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Various combinations and selections may be made of some or all of the disclosed elements within the scope of claims of the present invention. It will be understood that the present invention also covers various modifications and alterations that are possible by those skilled in the art in light of the entire disclosure and technical ideas including the scope of claims.

For example, in the foregoing embodiment, auto refresh is performed on all the memory banks and self refresh is performed on one memory bank. However, self refresh may be performed on two memory banks or three memory banks. Such a configuration can be implemented by changing the node that the input of the inverter circuit 223 of the pulse signal generation circuit 210 is connected to from the node N212 to the node N215 or the node N218. In the foregoing embodiment, all the memory banks are refreshed by the first refresh after a self refresh command is input. Instead, memory banks fewer than the total number of memory banks may be once refreshed, and then memory banks fewer than in the first refresh may be refreshed according to the cycles of the oscillator.

The foregoing embodiment has dealt with the case where memory banks each are regarded as a unit, and self refresh is performed in units of one memory bank. However, blocks each including a plurality of word lines may be regarded as a unit. For example, when a memory array 34 is divided into two blocks by means of the most significant bit of the internal row address, i.e., the internal row address XA12 and each block includes sense amplifiers, then self refresh may be performed in units of the blocks. In such a case, the circuits may be configured, for example, so that eight blocks are refreshed by an auto refresh operation, and two blocks by a self refresh operation. A configuration example is as follows: The refresh counter bank 15a includes, at the least significant order, a D-type flip-flop intended for the internal row address XA12 (configuration with a total of three bits). The resulting eight-bit address (internal bank address and internal row address) is input to the decoder 240. Eight row BANK latch circuits are provided to input eight refresh activation signals (a combination of two bits of internal row address XA12 and /XA12×the number of memory banks=8) memory bank by memory bank. In order to generate eight pulses, the pulse signal generation circuit 210 includes four additional circuits each including a delay circuit 219, a delay circuit 220, and a logic circuit 221 (an eight-input NAND circuit 222 is used, and the output of the last additional logic circuit is connected to the eighth input). Such a configuration can refresh eight blocks by an auto refresh operation and one block by a self refresh operation (the number of blocks can be increased by changing the connection destination of the input of the inverter circuit 223 as mentioned previously).

What is claimed is:

1. A semiconductor device comprising:
a plurality of memory banks each of which performs a refresh operation on a plurality of memory cells included therein when an associated one of refresh activation signals is activated; and
a refresh control circuit that performs a first refresh control operation when an auto refresh command is issued and performs a second refresh control operation when a self refresh command is issued, the refresh control circuit activating all the refresh activation signals during the first refresh control operation, and the refresh control circuit activating a part of the refresh activation signals without activating remaining one or ones of the refresh activation signals during the second refresh control operation.

2. The semiconductor device as claimed in claim 1, wherein the refresh control circuit performs, when the self refresh command is issued, the second refresh control operation after performing the first refresh control operation.

3. The semiconductor device as claimed in claim 2, further comprising:
a command decoder that activates a first refresh control signal when either one of the auto refresh command and the self refresh command is issued, and activates a second refresh control signal when the self refresh command is issued; and
an oscillator that generates a third refresh control signal at predetermined cycles when the second refresh control signal is activated,
wherein the refresh control circuit includes:
a first circuit that generates a fourth refresh control signal when either one of the first refresh control signal and the third refresh control signal is activated;
a pulse signal generation circuit that generates as many first pulse signals as the number of memory banks when the fourth refresh control signal is activated;
a selector that performs a first select operation of selecting all the first pulse signals and outputting them as second pulse signals when the first refresh control signal is activated, and performs a second select operation of selecting a part of the first pulse signals and outputting selected one or ones of the first pulse signals as the second pulse signal without selecting remaining one or ones of the first pulse signals when the third refresh control signal is activated; and
a plurality of second circuits each assigned to an associated one of the memory banks, each of the second circuits activating an associated one of the refresh activation signals based on the second pulse signal.

4. The semiconductor device as claimed in claim 3, further comprising a third circuit that activates a fifth refresh control signal when the fourth refresh control signal is inactivated and the second refresh control signal is activated,
wherein the selector performs the first select operation when the fifth refresh control signal is activated, and performs the second select operation when the fifth refresh control signal is inactivated.

5. The semiconductor device as claimed in claim 3, further comprising a refresh address counter having a first counter portion including a least significant bit of the refresh address counter and a second counter portion including remaining bits of the refresh address counter, wherein
the first counter portion indicates a bank address specifying one or ones of the memory banks,
the second counter portion indicates a row address specifying one or ones of word lines connected to the memory cells, and
a count value of the refresh address counter is updated based on the second pulse signal.

6. The semiconductor device as claimed in claim 5, wherein
the refresh control circuit further includes a decoder that decodes the bank address output from the first counter portion of the refresh address counter, and
the second circuits generate the refresh activation signals based on an output signal of the decoder and the second pulse signal.

7. The semiconductor device as claimed in claim 5, wherein the third circuit resets the count value of the first counter portion of the refresh address counter when the second refresh control signal is inactivated.

8. The semiconductor device as claimed in claim 1, wherein each memory bank is configured to perform a read operation or a write operation on the plurality of memory cells independent of performing the refresh operation.

9. The semiconductor device as claimed in claim 1, wherein the semiconductor device is a synchronous dynamic random access memory configured to operate in synchronization with a clock signal applied from outside the semiconductor device.

10. A semiconductor device comprising a plurality of semiconductor chips in stacked relation with one another, wherein each of the semiconductor chips comprises:
a plurality of memory banks each of which performs a refresh operation on a plurality of memory cells included therein when an associated one of refresh activation signals is activated; and
a refresh control circuit that performs a first refresh control operation when an auto refresh command is issued and performs a second refresh control operation when a self refresh command is issued, the refresh control circuit activating all the refresh activation signals during the first refresh control operation, and the refresh control circuit activating a part of the refresh activation signals without activating remaining one or ones of the refresh activation signals during the second refresh control operation,
the semiconductor chips are configured to receive the auto refresh command and the self refresh command individually from one another, and
the refresh control circuit included in each of the semiconductor chips performs the first refresh control operation and the second refresh control operation based on the auto refresh command and self refresh command issued to an associated one of the semiconductor chips.

11. The semiconductor device as claimed in claim 10, wherein each memory bank is configured to perform a read operation or a write operation on the plurality of memory cells independent of performing the refresh operation.

12. The semiconductor device as claimed in claim 10, wherein the semiconductor device is a synchronous dynamic random access memory configured to operate in synchronization with a clock signal applied from outside the semiconductor device.

13. A semiconductor device comprising:
a plurality of memory banks each including a plurality of memory cells, each memory bank performing a refresh operation on the memory cells included in the memory bank in response to an associated different one of refresh activation signals;
an oscillator that repeatedly activates a refresh control signal at predetermined cycles when a first refresh command is once issued; and
a refresh control circuit that activates a first number of the refresh activation signals when the first refresh command is issued, and activates a second number of the refresh activation signals each time the refresh control signal is activated, the second number being smaller than the first number.

14. The semiconductor device as claimed in claim 13, wherein the refresh control circuit activates a third number of the refresh activation signals when a second refresh command is issued, the second number being smaller than the third number.

15. The semiconductor device as claimed in claim 13, wherein the oscillator stops activating the refresh control signal when a refresh exit command is once issued.

16. The semiconductor device as claimed in claim 13, wherein each memory bank is configured to perform a read operation or a write operation on the plurality of memory cells independent of performing the refresh operation.

17. The semiconductor device as claimed in claim 13, wherein the semiconductor device is a synchronous dynamic random access memory configured to operate in synchronization with a clock signal applied from outside the semiconductor device.

* * * * *